United States Patent
Fonash et al.

(10) Patent No.: US 9,634,163 B2
(45) Date of Patent: Apr. 25, 2017

(54) LATERAL COLLECTION PHOTOVOLTAICS

(71) Applicants: Stephen J. Fonash, State College, PA (US); Handong Li, State College, PA (US); David Stone, Anaheim, CA (US)

(72) Inventors: Stephen J. Fonash, State College, PA (US); Handong Li, State College, PA (US); David Stone, Anaheim, CA (US)

(73) Assignee: LCCM Solar, LLC, Harrisburg, PA (US)

( * ) Notice: Subject to any disclaimer, the term of this patent is extended or adjusted under 35 U.S.C. 154(b) by 103 days.

(21) Appl. No.: 13/657,035

(22) Filed: Oct. 22, 2012

(65) Prior Publication Data
US 2013/0099342 A1  Apr. 25, 2013

Related U.S. Application Data

(63) Continuation of application No. 11/972,491, filed on Jan. 10, 2008, now Pat. No. 8,294,025, and a continuation-in-part of application No. 11/080,066, filed on Mar. 14, 2005, now Pat. No. 7,341,774, which is a continuation-in-part of application No.
(Continued)

(51) Int. Cl.
| | |
|---|---|
| *H01L 31/0352* | (2006.01) |
| *H01L 31/18* | (2006.01) |
| *B82Y 20/00* | (2011.01) |
| *H01L 31/0224* | (2006.01) |
| *H01L 51/44* | (2006.01) |

(52) U.S. Cl.
CPC ...... *H01L 31/035281* (2013.01); *B82Y 20/00* (2013.01); *H01L 31/022425* (2013.01); *H01L 31/022433* (2013.01); *H01L 31/03529* (2013.01); *H01L 31/18* (2013.01); *H01L 51/447* (2013.01); *H01L 51/445* (2013.01); *Y02E 10/549* (2013.01); *Y10T 428/24174* (2015.01)

(58) Field of Classification Search
None
See application file for complete search history.

(56) References Cited

U.S. PATENT DOCUMENTS 4,593,304 A * 6/1986 Slayman et al. ............... 257/457
5,997,956 A * 12/1999 Hunt et al. ..................... 427/446
(Continued)

*Primary Examiner* — Robert Carpenter
(74) *Attorney, Agent, or Firm* — Avery N. Goldstein; Blue Filamanet Law PLLC

(57) ABSTRACT

A nanostructured or microstructured array of elements on a conductor layer together form a device electrode of a photovoltaic or detector structure. The array on the conductor layer has a high surface area to volume ratio configuration defining a void matrix between elements. An active layer or active layer precursors is disposed into the void matrix as a liquid to form a thickness coverage giving an interface on which a counter-electrode is positioned parallel to the conduction layer or as a vapor to form a conformal thickness coverage of the array and conduction layer. The thickness coverage is controlled to enhance collection of at least one of electrons and holes arising from photogeneration, or excitons arising from photogeneration, to the device electrode or a device counter-electrode as well as light absorption in said active layer via reflection and light trapping of said device electrode.

8 Claims, 16 Drawing Sheets

Related U.S. Application Data

10/165,858, filed on Jun. 8, 2002, now Pat. No. 6,919,119.

(60) Provisional application No. 60/884,265, filed on Jan. 10, 2007, provisional application No. 60/946,250, filed on Jun. 26, 2007.

(56) References Cited

U.S. PATENT DOCUMENTS

| | | |
|---|---|---|
| 6,538,194 B1 * | 3/2003 | Koyanagi et al. ............ 136/256 |
| 6,873,087 B1 | 3/2005 | Choi et al. |
| 6,936,194 B2 | 8/2005 | Watts |
| 7,157,036 B2 | 1/2007 | Choi et al. |
| 7,189,435 B2 | 3/2007 | Tuominen et al. |
| 2004/0065976 A1 | 4/2004 | Sreenivasan et al. |
| 2005/0098205 A1 | 5/2005 | Roscheisen et al. |
| 2007/0212494 A1 | 9/2007 | Xu et al. |
| 2008/0169017 A1 | 7/2008 | Korevaar et al. |
| 2008/0169019 A1 | 7/2008 | Korevaar et al. |
| 2008/0176030 A1 | 7/2008 | Fonash et al. |
| 2008/0236661 A1 | 10/2008 | Yao et al. |
| 2009/0050487 A1 | 2/2009 | Fang et al. |
| 2009/0133751 A1 | 5/2009 | Sreenivasan et al. |
| 2009/0272422 A1 | 11/2009 | Li |
| 2010/0089443 A1 | 4/2010 | Bloomstein et al. |
| 2010/0090341 A1 | 4/2010 | Wan et al. |
| 2010/0150513 A1 | 6/2010 | Zhang et al. |
| 2010/0304521 A1 | 12/2010 | Seutter et al. |
| 2011/0024719 A1 | 2/2011 | Sridhar et al. |
| 2011/0046764 A1 | 2/2011 | Kan |

* cited by examiner

LATERAL COLLECTION PHOTOVOLTAICS

REFERENCE TO RELATED APPLICATION

This application is a continuation of U.S. patent application Ser. No. 11/972,491 filed Jan. 10, 2008, now U.S. Pat. No. 8,294,025, and also claims the benefit of U.S. Provisional Application No. 60/884,265 filed Jan. 10, 2007, and U.S. Provisional Application No. 60/946,250 filed Jun. 26, 2007, and is a continuation-in-part of U.S. patent application Ser. No. 11/080,066 filed Mar. 14, 2005, which is a continuation-in-part of U.S. patent application Ser. No. 10/165,858 filed Jun. 8, 2002, now U.S. Pat. No. 6,919,119, all of which applications are hereby incorporated by reference in their entirety into this application.

BACKGROUND

The present application relates generally to electronic and opto-electronic devices and a production method for the production of electronic and opto-electronic devices from an interpenetrating network configuration of nano structured high surface to volume ratio porous thin films with organic/inorganic metal, semiconductor or insulator material positioned within the interconnected void volume of the nano structure. The present application relates more specifically to lateral collection photovoltaic (LCP) structures.

Today, nanoparticles are proposed for, and used for, providing a high surface area to volume ratio material. Besides the large surface area they provide, nanoparticles can be embedded in organic/inorganic semiconductor/insulator materials (nano composite systems) to obtain a high interface area that can be exploited in, for example, the following optoelectronic and electronic applications: (a) charge separation functions for such applications as photovoltaics and detectors; (b) charge injection functions for such applications as light emitting devices; (c) charge storage functions for capacitors; and (d) ohmic contact-like functions for such applications as contacting molecular electronic structures.

There are difficulties with nanoparticles, however. These include their handling and, for electronic and opto-electronic uses, they also include the question of how to achieve electrical contact. In one approach for making optoelectronic devices from nanoparticle composite systems, isolated nanoparticles are diffused into a matrix of organic material. Each nanoparticle or nanoparticle surface must be electrically connected to the outside (by a set of electrodes) for electrical and opto-electronic function. This is achieved when the nanoparticles are arranged so that they are interconnected to the electrodes providing continuous electrical pathways to these particles. However, with the use of isolated nanoparticles, these particles will often fail to make good electrical contacts even if the volume fraction of nanoparticles is made close to unity.

Conventional photovoltaic operation uses some version of the basic horizontal structure seen in FIG. 1. Here light impinges on the horizontal layers and the resulting photo-generated electrons and holes, electrons and holes resulting from photogenerated excitons, or both are charge-separated with positive charge collected at the +charge-collecting electrode (anode) and negative charge collected at the −charge-collecting electrode (cathode), respectively. In the structure shown in FIG. 1, the device is composed of a p-type and an n-type solid semiconductor material, which semiconductor materials are functioning as the light absorbers, and as junction-formers creating the so-called built-in electric field providing the driving mechanism for charge separation. Other horizontal structures may use electron and hole affinity differences (band steps or band off-sets), with or without the built-in electric field mechanism, to drive charge separation. For photovoltaic action in FIG. 1, charge separation must result in electrons being collected at one electrode, the cathode, (bottom in FIG. 1) and holes being collected at the other electrode, the anode, (top in FIG. 1) giving rise to a current which can do external work (e.g., lighting a light bulb in FIG. 1).

Horizontal photovoltaic structures may be described in terms of two lengths: the absorption length, which is the distance light penetrates into the active (absorber) layer(s), e.g., the p-type and n-type layers shown in FIG. 1, before being effectively absorbed, and the collection length, which describes the distance in the active layer(s) over which photogenerated charge carriers can be separated and collected to the electrodes for use externally. In the case of photogeneration of excitons the collection length to be considered is usually the exciton diffusion length. The exciton diffusion length describes how far the excitons move by diffusion. The collection and the absorption lengths in horizontal structures such as the one shown in FIG. 1 are essentially parallel to one another. In these horizontal structures, the electrodes are usually solids although one or both can be electrolytes or some combination of electrolytes and solids. The electrodes can also be a porous solid structure or some combination of non-porous and porous materials.

The fact that the absorption and the collection lengths in the horizontal structure of FIG. 1 are essentially parallel means they are not independent. In horizontal structures such as that of FIG. 1, for effective photovoltaic operation, the appropriate collection length or lengths of the top active layer must be at least long enough to allow carriers generated by absorption in the top active layer to be collected and the appropriate collection length or lengths of the bottom active layer should be at least long enough to allow carriers generated by absorption in the bottom active layer to be collected and should be at least as long as the absorption length in that material for effective operation.

One alternative to the horizontal structure of FIG. 1 is a lateral collection approach that uses single crystal silicon structures using silicon (Si) wafer material. The Sliver® solar cell has been developed based on this concept. However, this lateral collection approach makes use of single crystal wafer silicon. The goal of the Sliver® approach is to use conventional silicon wafer-type material but, through the use of lateral collection, to reduce the amount of this expensive form of Si needed for the solar cell. In this process, single-crystal silicon is, for example, cut in 50 μm thick, 100 mm long, and 1 mm deep strips. The surrounding silicon holds these strips together. The Sliver® solar cell uses conventional silicon technology, but in a "slivered" configuration.

Intended advantages of the disclosed systems and/or methods presented herein teach configurations for the improvement of photovoltaic structures preferably fabricated from relatively low cost materials. Other features and advantages will be made apparent from the present specification. The teachings disclosed extend to those embodiments that fall within the scope of the claims, regardless of whether they accomplish one or more of the aforementioned needs.

SUMMARY

The present application addresses some of the problems in the field by using disposed high surface to volume ratio materials, as opposed to other techniques such as the "slivering" approach. The disposed high surface to volume ratio materials permit a manageable high interface area which is easily contacted electrically.

The present application involves positioning a nanostructured or microstructured high surface area to volume ratio material on a conductor or conductive substrate or a patterned set of electrodes on a substrate. The basic elements (building blocks) of this nanostructure (or microstructure) are embedded in a void matrix with the attributes of high surface to volume ratio but with electrical connectivity to the conductor. Once the void network of the film material is filled with an active material, a composite is formed with high interface area. Furthermore, each component of the composite structure is conformally connected. Hence, any region of the composite system including the interface has continuous electrical connection to the outside.

One embodiment of the present application is directed to a method of fabricating an electronic/optoelectronic device from an interpenetrating network of a nanostructured (or microstructured) high surface area to volume ratio material and an organic/inorganic matrix material having the steps of: a) obtaining a high surface area to volume ratio film material onto an electrode substrate (or a patterned electrode substrate), such that any region of this film material is in electrical connectivity with the electrode substrate by virtue of the morphology. For example, the film material may comprise an array of nano and/or micro-protrusions electrically connected to the electrode substrate and separated by a void matrix; b) filling the void matrix of the high surface to volume film with an organic/inorganic solid or liquid material; and c) defining an electrode or set of electrodes onto the organic or inorganic intra-void material embedded in the void matrix.

Another embodiment of the application uses an array of nano and/or microprotrusion collecting elements and spacing for lateral collection photovoltaic (LCP) structures. The collecting elements may be metals, semiconductors or both and, in some embodiments, involve insulators. In one set of embodiments, the collecting elements (constituting the anode or cathode) are arrayed on a conducting layer or substrate, in which case they are electrically and physically in contact with the conductor. In such a configuration, the array of elements and the conductor constitute the electrode. The collecting elements may themselves also serve as the conductor and therefore may be the complete electrode in another embodiment. These collecting elements are substantially perpendicular to the conductor. In all the described embodiments, an absorber, or more generally an active material, is disposed among the collector elements. As used herein, active material may include a material with one or more absorber materials combined with none, one or more collector (separator) materials or materials that improve the interface contact between the active materials and the electrodes or conductors. All collector elements and absorber or active materials are disposed in some manner including, etching, physical deposition, chemical deposition, in situ growth, stamping, or imprinting. The collector element material can be a conductor or semiconductor, which may also function as an absorber. This application also includes several different shapes for the collector structure and its elements. The inter-collector element positioned absorber or active material may be organic or inorganic and crystalline (single or poly-crystalline) or amorphous. The absorber or active material may be solid or liquid, or some combination thereof. In a further embodiment, the collecting elements are nano-elements grown from nanoparticle catalysts or discontinuous catalyst film. The collecting elements may not necessarily be arrayed perpendicular to the conductor in these embodiments.

In another set of embodiments for the lateral collection concept, the substrate is not conducting and anode and cathode elements are laterally arrayed side by side. In a further set of embodiments for the lateral collection concept, at least the anode or the cathode, which is composed of an array of nano and/or micro-scale collecting elements, does not have direct physical and electrical contact to any conducting substrate. In one embodiment, one electrode is a composite wherein a conductor is separated by an insulator, which is part of each collector element, from the opposing electrode and this opposing electrode is a conductor covering a surface. In still another embodiment, the collection structure is a composite containing both the anode and cathode collecting elements for lateral collection. The opposing electrode may or may not be in contact with a conductor covering a surface.

A further embodiment is directed to a photovoltaic device having a first conductive layer, a collection structure in physical and electrical contact with the first conductive layer, an active layer disposed adjacent to the first conductive layer and in contact with all surfaces of the collection structure, and a second conductive layer disposed opposite the first conductive layer and in contact with the active layer. The active layer has an absorption length and a collection length. The collection structure includes a plurality of collector elements positioned substantially perpendicular to the conductive layer. The plurality of collector elements extending from the first conductive layer by a distance corresponding to the absorption length of the active layer and the plurality of collector elements being spaced apart by a distance corresponding to two times the collection length of the active layer.

Certain advantages of the embodiments described herein lie in applications in power generation, such as photovoltaic cell use. The disclosed embodiments may also be applicable to photodetectors, chemical sensors, electroluminescent devices and light emitting diode structures. In the case of the electroluminescent devices and light emitting diode structures, carrier flow direction is reversed from photovoltaic devices and carriers are injected instead of collected. The disclosed embodiments, with their large electrode areas and various electrode configurations, have application to chemical batteries, fuel cells, and capacitors.

Alternative exemplary embodiments relate to other features and combinations of features as may be generally recited in the claims.

BRIEF DESCRIPTION OF THE FIGURES

Wherever possible, the same reference numbers will be used throughout the figures to refer to the same or like parts.

DETAILED DESCRIPTION OF THE EXEMPLARY EMBODIMENTS

Figure 1:
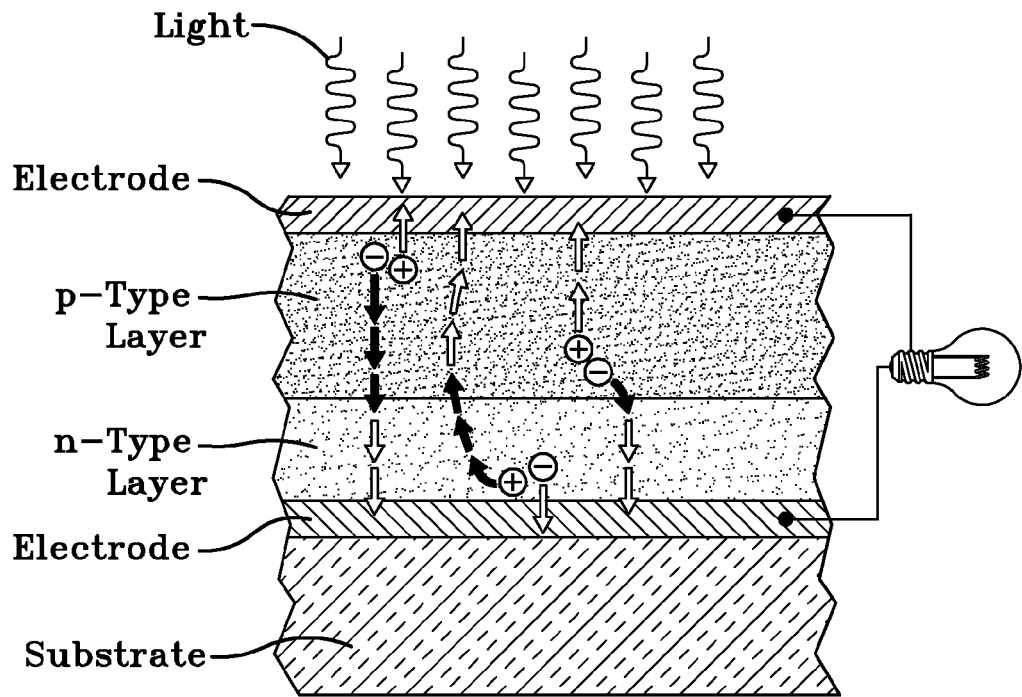
FIG. 1 illustrates a prior art device incorporating conventional photovoltaics.
Figure 2:
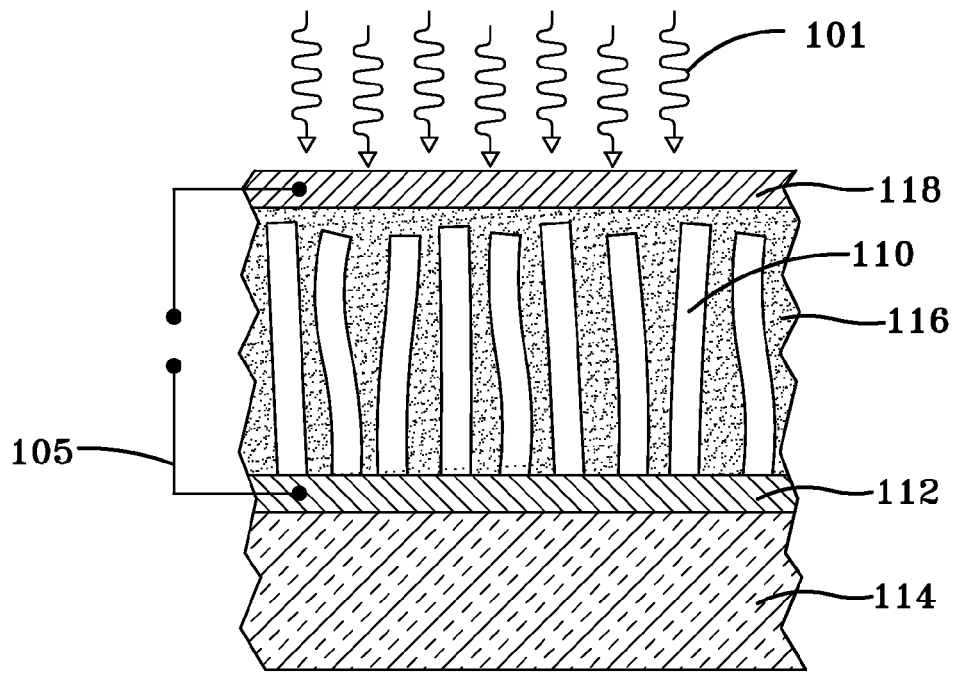
FIG. 2 illustrates a lateral collection photovoltaic structure.

FIG. 2 shows a lateral collection photovoltaic structure. The lateral collection structure of FIG. 2 has many of the features of the horizontal configuration of FIG. 1, except that the collection lengths involved in the structure of FIG. 2 are essentially perpendicular to the absorption length. Thus, the collection and absorption lengths have become independent of one another. The lateral collection structure of FIG. 2 can have a collecting interface within a collection length of essentially all of the active material. The lateral collection structure of FIG. 2 is described in detail in U.S. Pat. Nos. 6,399,177, 6,919,119 and U.S. Patent Application Publication No. 2006/0057354, which patents and application publications are hereby incorporated by reference into the application in their entirety.

The lateral collection photovoltaic structure of FIG. 2 can be fabricated from an interpenetrating network of a film material and a metal, semiconductor, or insulator material forming a large interface area. The high surface area to volume film material can include collector structure 110, i.e., an array of one or more collector elements, e.g., an array of nano- and/or micro-protrusions, separated by voids or a void matrix, on a conductive layer 112, which conductive layer 112 is on a non-conductive substrate 114. In another embodiment, the substrate can be a conductive material and can operate as the conductive layer. The combination of the collector structure 110 and the conductive layer 112 can operate as an electrode for the photovoltaic structure.

The nano- and/or micro-protrusions can have various other morphologies as long as the nano- and/or micro-scale basic elements each have continuous charge conduction paths to the conductive layer or conductor 112 or themselves play the role of conductor. As used herein, nano-scale refers to dimensions between about 1 nm and about 100 nm and micro-scale refers to dimensions between about 100 nm and less than a 1000 µm. The void volume can be filled with an appropriate active layer 116 such as an organic/inorganic semiconductor material. A second conductor (or set of nano- and/or microprotrusion elements in contact with a second set of conductors) 118 is positioned onto the active layer 116 forming the device counter electrode. Contacts 105 are in electrical connection with conductors 112 and 118 to provide a connection to the outside world.

In another embodiment, the basic elements of the high surface area to volume film material can include nanostructures, e.g., nanotubes, nanorods, nanowires, nanocolumns or aggregates thereof, oriented molecules, chains of atoms, chains of molecules, fullerenes, nanoparticles, aggregates of nanoparticles, and any combinations thereof or microstructures. The basic materials of the high surface area to volume film can comprise silicon, silicon dioxide, germanium, germanium oxide, indium, tin, gallium, cadmium, selenium, tellurium, and alloys and compounds thereof, carbon, hydrogen, oxygen, semiconductors, insulators, metals, ceramics, polymers, other inorganic material, organic material, or any combinations thereof. The electrode-elements structure high surface area to volume film can be deposited onto the conductive layer 112 or on a patterned substrate (if the substrate is conductive) by, for example, chemical vapor deposition, plasma-enhanced chemical vapor deposition, physical vapor deposition, or electrodeposition. The film may also be obtained by etching or electrochemical etching.

The active layer material may comprise organic and inorganic semiconductors, semiconductor particles, metal particles, an organometallic, a self assembling molecular layer, a conjugated polymer, and any combinations thereof. The active layer material or its precursors may be applied in liquid form, molten form, dissolved in a solvent, or by electrochemical means. Additionally, the active layer material may be embedded into the void matrix by exposing the thin film material to the vapor of the active layer material or its precursors, thus causing the vapor to condense inside the void matrix. Such vapor may be produced by chemical vapor deposition and physical vapor deposition techniques including nebulization. In one embodiment, the active layer may be a heterogeneous mixture or layered structure of multiple materials.

As discussed above, light 101 impinges on the structure and the resulting photogenerated electrons and holes, electrons and holes resulting from photogenerated excitons, or both are charge-separated with positive charge collected at the +charge-collecting electrode (anode) and negative charge collected at the −charge-collecting electrode (cathode), respectively. For photovoltaic action, charge separation must result in electrons moving to one electrode, the cathode, and holes moving to the other electrode, the anode, giving rise to a current. As mentioned above, the collection structure 110 and the conductive layer 112 can operate as either the anode or the cathode.

If excitons are produced by photoexcitation (i.e., are photogenerated), the collector elements of the collection structure 110 should also be able to collect (by diffusion in the active layer 116) any excitons, which are not converted into electrons and holes in the active region 116, to collector element surfaces in order to enable exciton conversion, at these surfaces, into free electron and hole pairs. The collection of excitons establishes a lateral exciton collection length. If the active layer 116 is composed of multiple components, the lateral exciton collection length is an effective exciton collection length.

If electrons and holes are produced directly by photoexcitation (i.e., are photogenerated) or produced by photogenerated excitons breaking up in the active material, the collector elements of the collection structure 110 should be able to collect (by drift, band edge variations, diffusion, and any combination thereof in the active layer 116) to collector element surfaces either the free electrons or holes. The collection of electrons or holes establishes a lateral free carrier collection length. If the active layer 116 is composed of multiple components, the lateral free carrier collection length is the effective free carrier collection length. Generally, the selection of the free carrier (electrons or holes) determines the inter-element array spacing C for the collector structure 110, which is based on which free carrier has the poorer mobility, or equivalently, the poorer collection length. If excitons are to be broken up by the collection element surfaces, the collection structure 110 can be designed such that the exciton collection length is no less than about half the inter-element array spacing C of the collection structure 110. The other free carriers (electrons or holes) not taken up by the collection structure 110 should have a collection length, termed the vertical collection length, of substantially about the longest distance to the counter electrode.

If excitions are the principal entities collected at the collector element surfaces, the collection structure 110 can be designed with the excitons determining the lateral collection length and thereby determining the inter-element or collector structure array spacing C. If free carriers are the principal entities collected at the collector element surfaces, the collection structure 110 can be designed so that the carrier collected is the one with the lower mobility. In this case, the collection length of the free carrier is the lateral collection length and the lateral collection length determines the collector structure spacing C. Whether the collecting elements of the collection structure 110 are principally collecting excitons or free carriers, the collection structure 110 provides a collecting interface within the appropriate collection length of essentially all of the active material. The collection structure 110 may or may not itself be an absorber. This flexibility is possible since the collection structure 110 (and its corresponding collector elements), if chosen not to be an absorber, should present at least one dimension W to the incoming light 101 which is preferably in the nano-scale thereby creating a minimized dead (non-light-absorbing) volume. Depending on the material used for the collection structure 110, the collection structure 110 may, in addition to collecting photogenerated entities (excitions and/or free carriers), be (1) an absorber, (2) used for enhanced light reflection and trapping, (3) used to attach quantum dots, monolayers, or other materials to enhance performance, and (4) the source for plasmons for interaction with the absorption process. In addition, the active materials have all the possibilities discussed above, as do the conductor materials.

Figure 3:
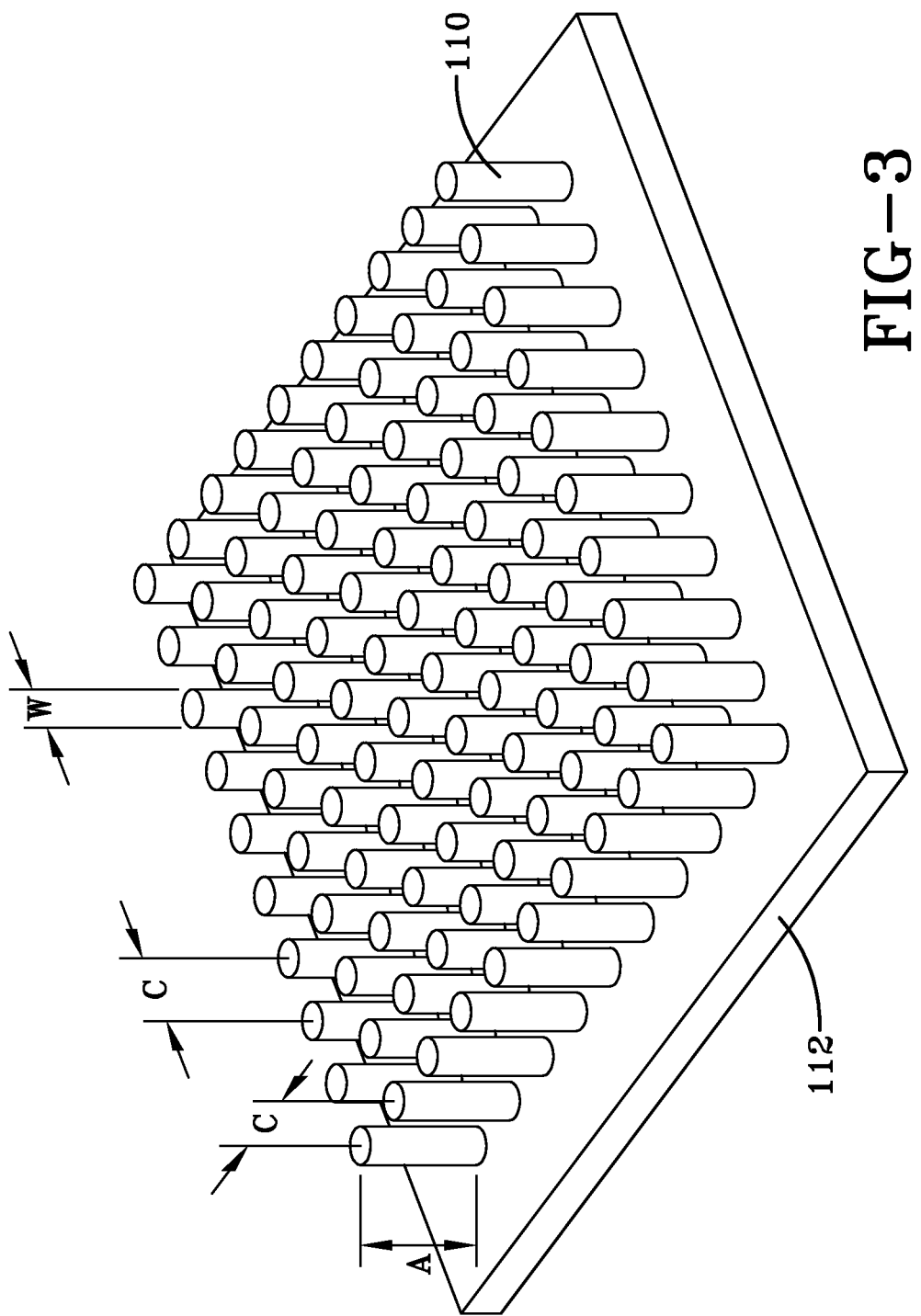
FIG. 3 illustrates a collecting structure with column-like elements.
Figure 4:
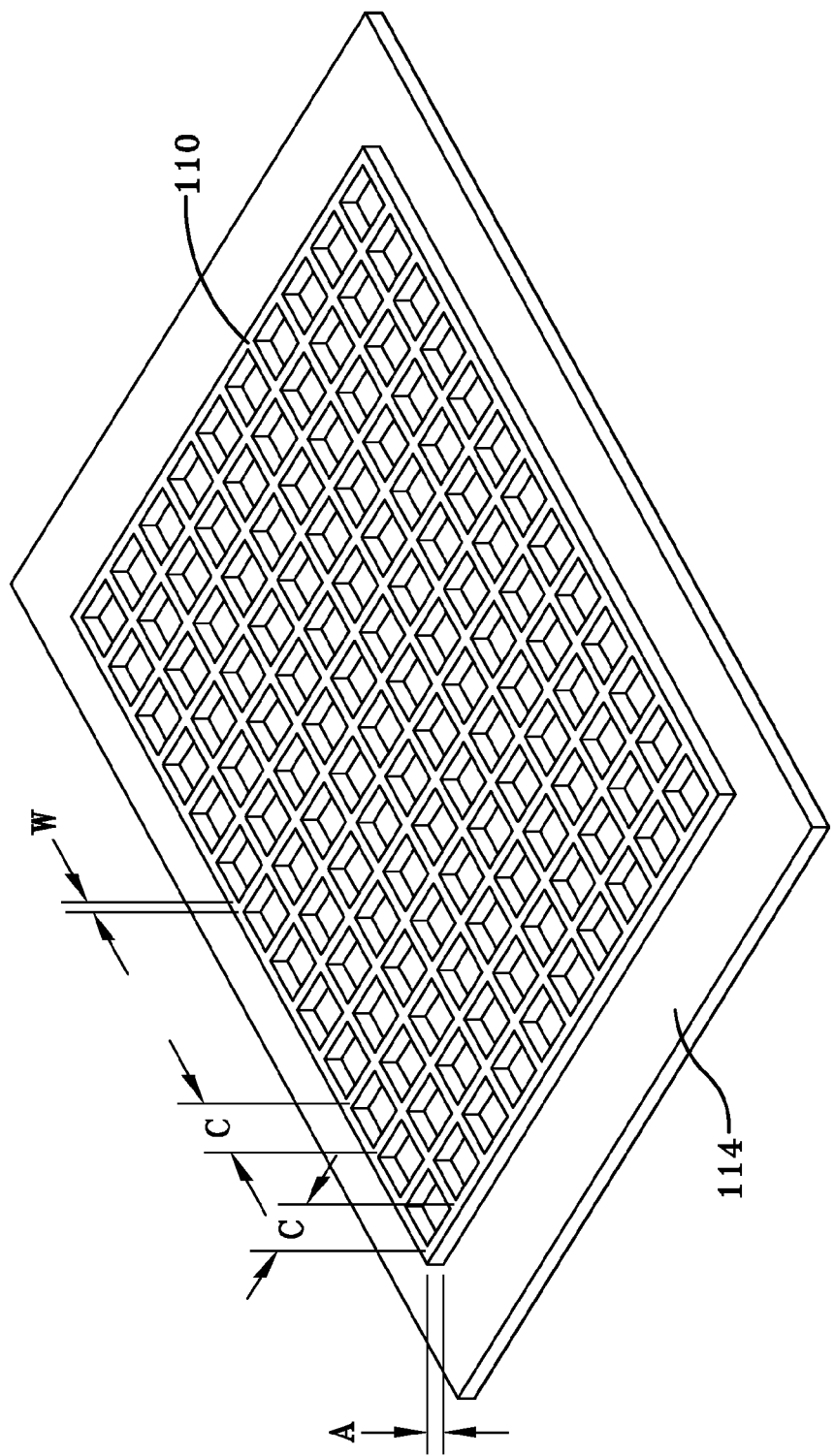
FIG. 4 illustrates a collecting structure with honeycomb-like elements.
Figure 5:
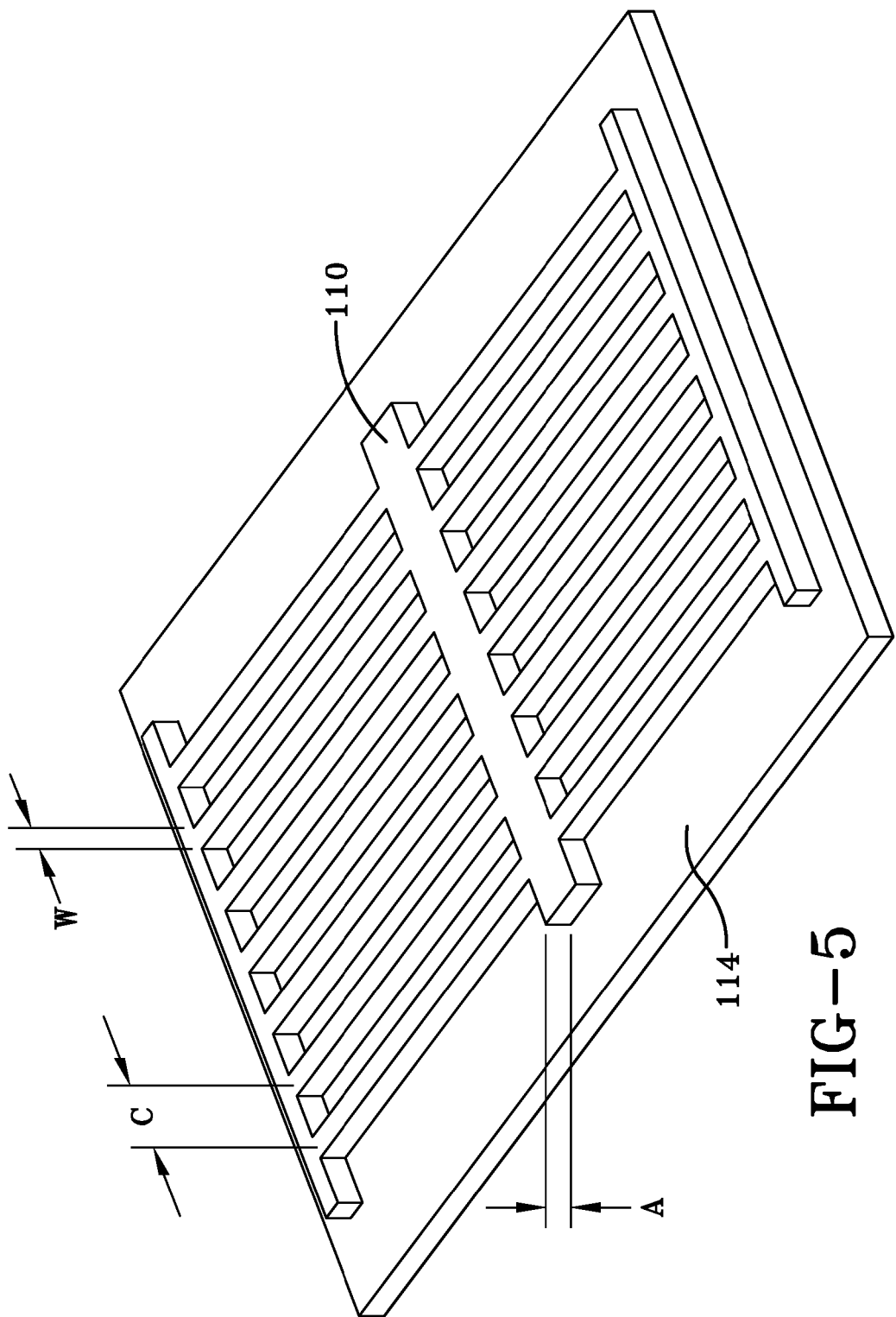
FIG. 5 illustrates a collecting structure with fin-like elements.

Various shapes may be used for the lateral collection structures of the application. FIGS. 3-5 show three embodiments of collection structures 110 (and corresponding collector elements). The collection structure embodiments of FIGS. 3-5 and combinations and variations thereof, may be disposed on a conductor 112. However, in the embodiments of FIGS. 4 and 5, the collection structure 110 may serve as the electrode without a conductor and be disposed directly on the substrate 114. FIG. 3 shows a collection structure composed of an array of column-like collector elements similar to FIG. 2. FIG. 4 is a collection structure composed of an array of "honeycomb-like" collector elements, whereas FIG. 5 is a collection structure composed of an array of "fin-like" collector elements. While FIGS. 3-5 illustrate several examples of collection structures 110, it is to be understood that any suitable lateral collection structure can be used.

Figure 19A:
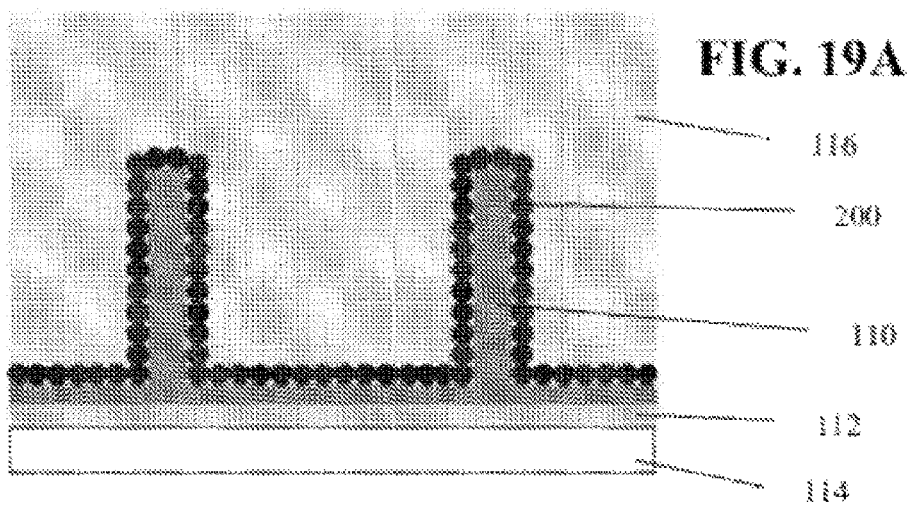
FIGS. 19A and 19B illustrate the use of quantum dots in an active layer.
Figure 19B:
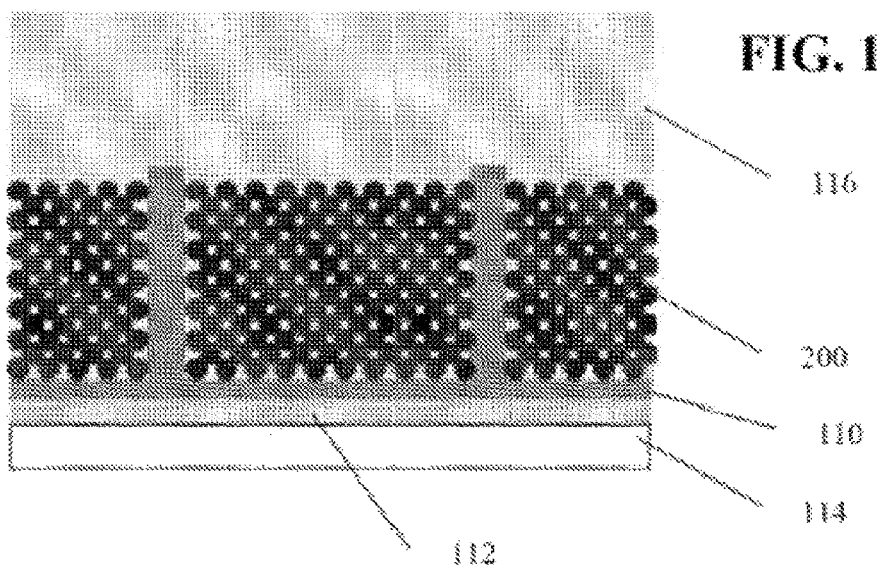

When using an electrode collection structure 110 in a photovoltaic cell, the characteristic array spacing dimension C seen in FIGS. 3-5 can be chosen to be approximately twice the lateral collection length (exciton or free carrier, as appropriate) of the active material used to fill the voids or areas between the collector elements or the inter-collector element region. The active material disposed in the inter-collector element region in FIGS. 3-5 is such that it has an interface for collection with the collection or collector structure 110 of these embodiments. The dimension A in FIGS. 3-5 is based on the absorption length of the active (or absorber) material and the vertical collection length, when appropriate. As noted, active materials contain an absorber material or materials and may be combinations of organic or inorganic semiconductor materials, light absorbing molecules and may contain dyes, nanoparticles such as quantum dots 200 (see FIGS. 19A and 19B), or plasmon-generating metal particles, or some combination thereof. Either or both of the conductors or elements of the electrodes in a photovoltaic structure based on the collection structures 110 of FIGS. 3-5 may be a transparent, conducting material including, for example, tin oxide, zinc oxide or indium tin oxide. Reflecting structures may be constructed behind or using one of the conductors of the electrodes. The collector structure 110 may also be the entire electrode (i.e., there is no conductive layer residing between the elements of collector structure 110), reflector/light trapping structure or both.

In a photovoltaic structure based on the collection structure 110 of FIGS. 3-5, the active materials have at least one dimension C of the order of twice the lateral collection length and another dimension A of the order of the absorption length or, if appropriate, the vertical collection length. When the vertical collection length is involved, dimension A can be the lesser of the absorption length and the vertical collection length. In a photovoltaic structure based on the collection structure 110 of FIGS. 3-5, both the active (absorber) and collector materials can be produced using techniques such as etching and/or deposition, in situ growth, stamping, or imprinting. Deposition techniques that may be used include chemical vapor deposition, liquid deposition including electrochemical growth methods, and physical vapor deposition approaches.

The active material resides among the collecting elements of the collector structure 110. The active material may be formed using a number of approaches. A discussion of several, but not all, such approaches is provided below.

Figure 6:
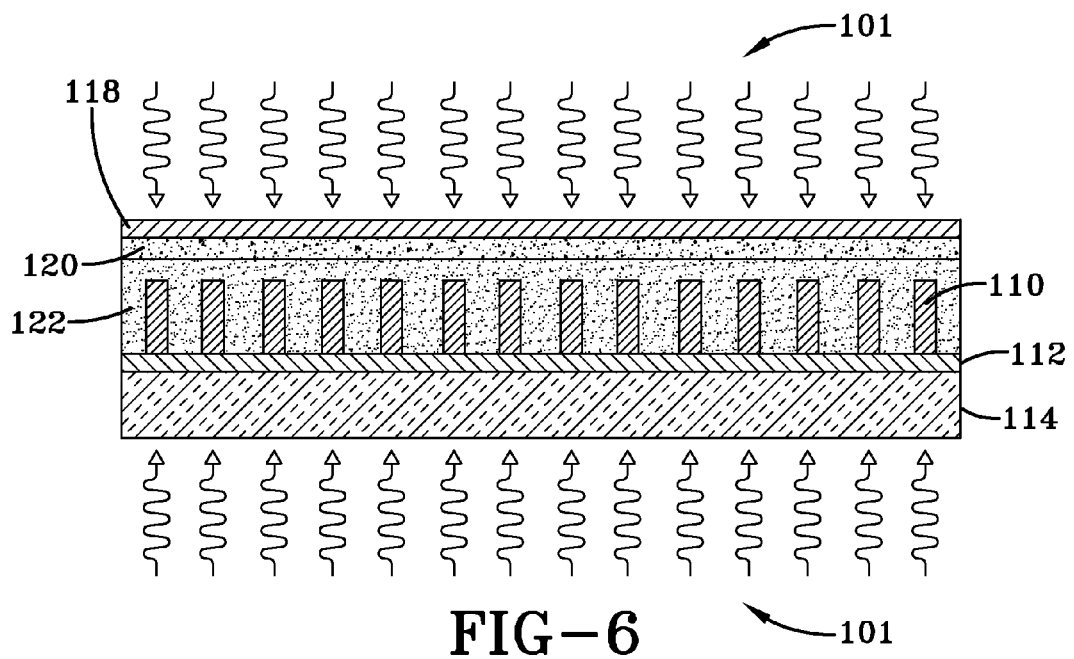
FIG. 6 illustrates an embodiment using amorphous-Si.

The active material may be a deposited thin film amorphous silicon (a-Si:H). Typical thin film a-Si:H can have a collection length of about 0.1 μm to about 1 μm and an absorption length of less than about 1 μm. FIG. 6 shows an embodiment of a photovoltaic device or cell incorporating the column, honeycomb, or fin collector elements of the collector structure 110 (shown in cross-section) of FIGS. 3-5. The array spacing between the collector elements of the collector structure is in the range of about 0.2 μm to about 2 μm, i.e., into or in the micro-scale, for the a-Si:H material. The thin film a-Si:H of the embodiment of FIG. 6 can be doped as needed and deposited using standard techniques such as plasma deposition or low pressure chemical vapor deposition (LPCVD). The former can involve temperatures as low as about 20° C. or lower. The latter usually involves temperatures of approximately 550° C. or lower. In the embodiment of FIG. 6, the collector structure 110 has been chosen to be a metal and the top conductor or electrode 118 is a transparent conducting oxide with a doped a-Si:H layer 120 under the top electrode 118 and a doped or undoped a-Si:H layer 122 under the doped a-Si:H layer 120. In another embodiment, the a-Si:H may be arranged such that the layer under the top electrode 118 is n- or p-type material and the collector structure 110 may be a semiconductor material. If collector structures 110 with collector elements such as the fin or honeycomb-like collectors are used, it is possible to omit the electrode under the collector structure 110, i.e., structures which provide a lateral electrical continuous path may function also as electrodes and be connected to electrical leads 105. Furthermore, the collector structures 110 may be used to adhere, using standard tethering and attachment methods, interface layers, particles such as quantum dots, or particles that give multiple electron/hole pair generation per absorbed photon. The collector structures 110 also may serve as reflecting/light trapping structures or parts thereof and as sources of plasmons for impacting absorption processes. As in all embodiments, the material composition of a collector structure 110 (and corresponding collector elements) is selected to address collector resistance, the requisite workfunction difference (with the counter electrode) to aid in setting up the built-in collecting electric field, or to have band steps (off-sets) to aid in collection, or some combination thereof.

The collector structure 110 may be produced by various techniques including (1) etching, (2) deposition, (3) in situ growth, (4) stamping or by (5) imprinting, including, impressing in (inlaying) the actual collector structure 110. In the deposition technique, an exemplary approach to fabrication is to have the collector pattern transferred to a patterned block co-polymer or patterned resist obtained using lithography techniques, which may include beam, imprint, stamp or optical methods. For example, the collector material can be deposited into the resulting patterned block co-polymer or resist as a thin film and then patterned by lift-off, producing structures such as those seen in FIGS. 3-5. When a block-co-polymer material is used deposition can be carried out with the block-co-polymer in place but one phase removed. The regions where the removed phase had resided become the positions of the collector elements. The remaining polymer can then be removed using standard lift-off techniques.

In the in situ growth case, the elements of the collector structure 110 are grown in a shape such as those of FIGS. 3-5. The growth of the elements of the collector structure 110 may be accomplished, for example, using a vapor-liquid-solid (VLS) technique wherein a pattern catalyst is first positioned on a surface (if the collector structure 110 is to be the entire electrode) or on the bottom conductor 112 which is on a surface (if the collector structure 110 is to be residing on a conductor, which may be patterned). The catalyst may be disposed on a patterned conductor by techniques such as self-assembly (e.g., catalyst particles tethered onto patterned Au using thiol bonds) or it may be patterned using, for example, any of the etching or deposition techniques discussed above for patterning a deposited material as well as by other techniques such as ink jet printing or the dip pen approach. The collector elements themselves are then grown from a precursor at the catalyst positions at the required temperature. For example, if the collector structure 110 is to be silicon, then the precursor is a silicon bearing compound such as silane and the temperature, using gold (Au) as the catalyst, can be around 550° C. or less. Material bearing a dopant may also be used with the catalyst or with the precursor if the silicon (Si) is to be doped. Any residual catalyst present after growth may be removed from the collector elements using an etchant specific to the catalyst (e.g., a gold etchant for an Au catalyst for Si growth). Nanoparticle catalysts for collector growth can be employed to automatically attain advantageous aspect ratios (A/W) in FIGS. 3-5, i.e., greater than one, for collector structures 110 where W is a measure of the collector element characteristic width. For example, if a nanoparticle catalyst for carbon nanotubes or wires is stamped onto a surface in the collector pattern, nanotube or wire growth can be exploited to give essentially perpendicular collector elements with advantageous aspect ratios. These structures can be used, as manufactured, as the collector elements, or coated (e.g., by electro-chemical means).

In the imprinting case, the collector structure 110, which may be on a substrate including glass, metal foil, or plastic, is positioned by being pressed (in layed) into an already present active (absorber) material thereby also resulting in the structure of FIG. 6. Collector structures 110 for this in lay approach are produced in the same way collector structures 110 are produced in the discussion above, e.g., they may be produced by etching or deposition and techniques used may employ block-co-polymers, printing or stamping techniques, optical or e-beam lithography, and deposition/lift off or other approaches such as electrochemical deposition. In this embodiment, the collector elements may be on a conducting surface or be the entire electrode themselves.

Catalyst positioning and techniques such as deposition by nebulization or by vapor-liquid-solid (VLS) deposition may also be used to form the active material of the inter-collector-element region or the absorber or collector structure 110. The collector structure 110 may also be an absorber itself. In all these structures, light may impinge from the side (top or bottom) on which the collector structure 110 is placed or from the other side. Thus, in these types of structures, light can impinge the top side, the bottom side or both the top and bottom sides, except when a reflector is used in the structure. In the top/bottom electrode arrangements (e.g., FIGS. 2-6), the collector structures 110 may be positioned at the top or bottom or both the top and bottom, if so desired.

In another embodiment, the active material positioned between the collector elements is thin film crystalline Si produced by one of three techniques: (1) crystallization of a-Si, (2) deposition of polycrystalline Si, or (3) a catalytic process such as vapor-liquid-solid (VLS) deposition.

Amorphous Si (a:Si) can be converted into polycrystalline silicon (poly-Si) using solid phase crystallization (SPC) done by furnace annealing or rapid thermal annealing (RTA). Thin film amorphous silicon, deposited between the collector elements, can be converted by SPC into poly-Si absorber material after the entire cell is fabricated or after the a-Si materials are deposited. If RTA is used, an example temperature-time step is given by noting that 750° C. RTA exposure can produce the needed crystallization in less than one minute. Typical SPC poly-Si can have a collection length of ~10 μm and an absorption length of ~10 μm. The collection length and absorption length determine the dimensions C and A of the collector structure 110 whose elements can have nano-scale W values, e.g., column diameter, fin thickness, or honeycomb thickness, if a non-absorber. If the elements are an absorber material, these diameter/thickness W dimensions need not be in the nano-scale, but would be optimized for efficiency while maintaining the dimensions C and A.

Thin film polycrystalline silicon and/or germanium can be directly deposited as an absorber positioned between collector elements, e.g., by LPCVD at temperatures of approximately 580° C. or higher. Typical deposited poly-Si can have a collection length of about 5 µm and an absorption length of about 10 µm. The collection length and absorption length determine the dimensions C and A of the collector structure 110.

Figure 7:
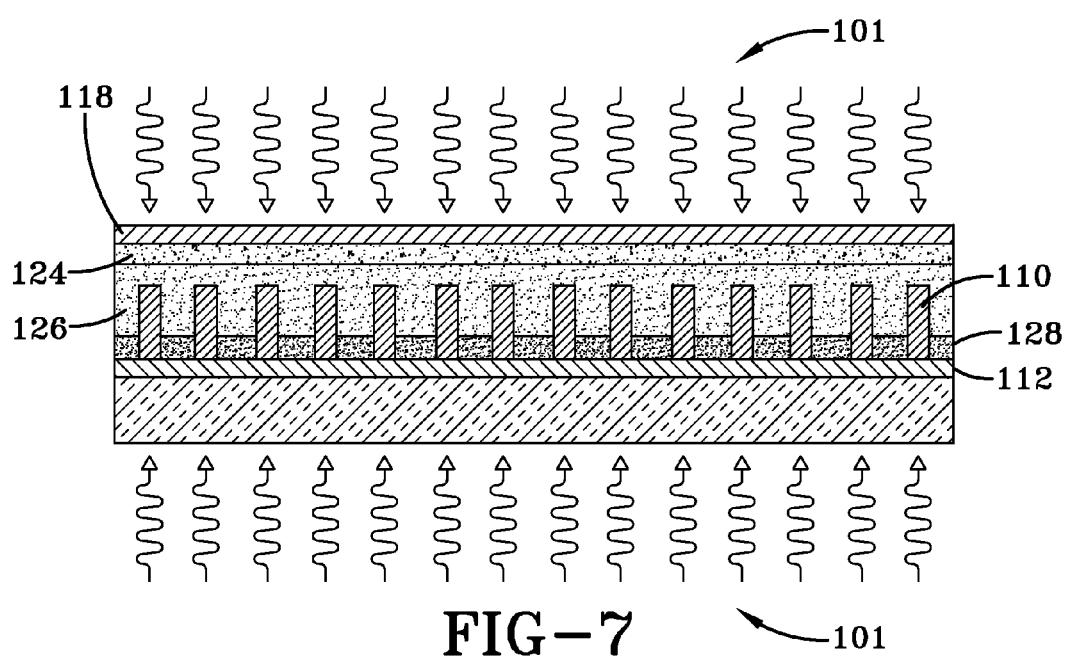
FIG. 7 illustrates growth of the absorbing active layer using a catalyst layer positioned among the collector elements.

Thin film crystalline silicon and/or germanium and other absorber materials can be directly deposited by vapor-liquid-solid (VLS) and related deposition techniques at the region between the collector elements. In this embodiment, a catalyst 128 such as Au for Si VLS growth may be deposited as seen in FIG. 7. In the embodiment shown in FIG. 7, the region between the collector elements can include a doped poly-Si layer 124 and a counter doped, undoped or both VLS Si layer(s) 126. Deposition of the catalyst 128 may be accomplished with any of the standard techniques such as physical vapor deposition and chemical vapor deposition, electro-chemical deposition or self-assembly. The catalyst 128 may be placed directly on the substrate 114, if the collector structure 110 is to also function as the electrode, or the catalyst 128 may be positioned on the conductor 112. Self-assembly by tethering such as by the linking of catalyst Au particles by thiol bonds to the conductor may be employed with the conductor present. The substrate 114 with the collector structure 110 and VSL catalyst layer 128 on it is then placed in a VLS reactor. A silicon precursor such as silane is introduced (at T~450-550° C. for Au as the catalyst) and the Si precursor breaks down resulting in Si building up in a liquid phase Au/Si alloy in the Au film. Then Si is expelled as the Si concentration exceeds a critical level resulting in crystalline Si growing in the inter-collection element regions. The catalyst (e.g., Au) 128 may then be etched off the crystalline Si outer surface as needed. Since this material can be of high crystallinity, its collection length and absorption lengths can at least be those of poly-Si. These lengths determine the dimensions C and A of the collector structure 110 utilized.

In this VLS absorber growth approach, the catalyst 128 may be positioned with the collector elements present. If desired, the catalyst 128 may be kept off the top surfaces of the collector elements by means such as masking. Alternatively, the catalyst 128 may be positioned before the collector elements are present. In this embodiment, the catalyst 128 is deposited using standard approaches with the requisite pattern needed to accommodate the collector structure 110 to be used. This pattern may be generated using approaches comprising block-co-polymer, stamping, imprinting, or beam or optical lithography methods and lift-off and/or etching. After VLS growth, the collector may be positioned with the absorber regions dictating the collector pattern by, for example, using deposition. Lift-off and/or etching may be used also.

The fabrication of a solar cell using a collector structure 110 (and corresponding collector elements) such as that seen in FIGS. 3-5 may make use of a compound semiconductor as the active material positioned among the collector elements. In this embodiment, the compound semiconductor can be used as an absorber only or an absorber/collector and may include the addition of organic or inorganic particles or molecules. Techniques for depositing such thin films are well known and include VLS-type approaches similar to those discussed above including colloidal chemistry techniques.

An organic material or materials can be directly disposed as the active material positioned between collector elements by a variety of physical and chemical methods. Included among the physical methods are sublimiation, nebulization and casting. Included among the chemical methods are electrochemical polymerization, vapor-phase reaction, vapor-phase polymerization, surface-initiated polymerization, and surface-terminated polymerization. In the latter approaches, an element or compound may be deposited on a surface and utilized as a reaction initiator. The nature of the association between the initiator and substrate is a chemical bond (ionic or covalent), a weak association such as hydrogen bonding, or dipole-dipole interaction. While the processes described can be used to create the active layer (absorber) between the collector elements, the processes can also be used to form collector elements in the active region, and to form surface layers for the collector elements. These processes can also be directed to take place on a flat substrate for the express purpose of creating collector elements themselves.

In surface initiated approaches to active layer formation, organic molecules are exposed in one approach to the substrate-bound or collector element-bound initiator, initiating a desired chemical reaction. The molecules available for reaction vary in size from that of essentially several atoms to that of macromolecules. The reaction proceeds as long as molecules are present to propagate or until a termination molecule is introduced. The final molecules produced may be highly ordered with a controllable thickness. Vapor-phase polymerization or surface-initiated polymerization may be used.

In surface terminated approaches, a macromolecule is formed in solution under conditions which give the desired physical and chemical properties. The macromolecule is then exposed to the surface containing the termination group. The termination group located on the surface ends the propagation of the macromolecules while simultaneously anchoring them to the surface. This approach allows for the use of typical solution polymerization techniques, while maintaining control of surface coverage and density.

Figure 8:
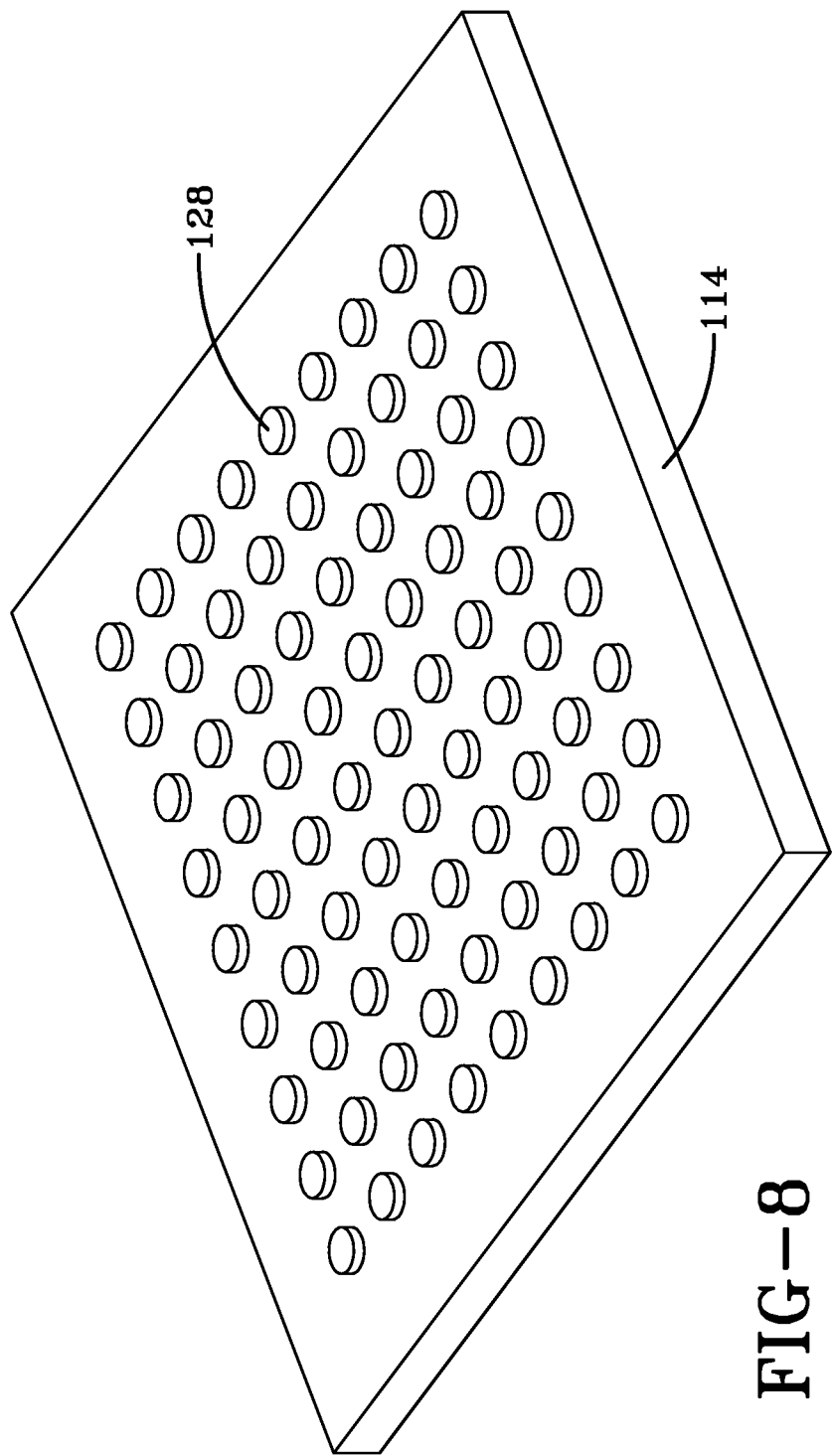
FIG. 8 illustrates a patterned catalyst on the substrate.
Figure 9:
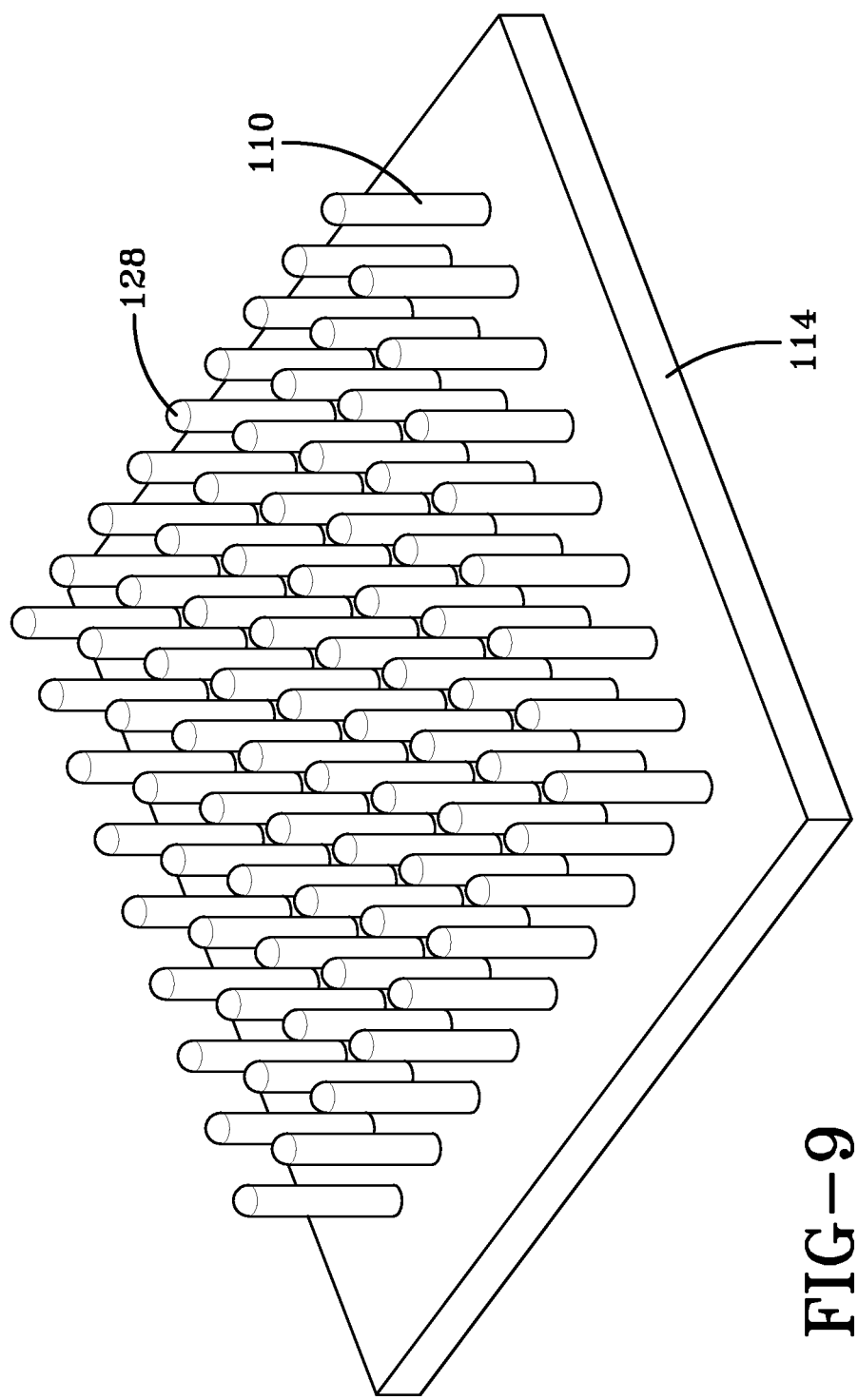
FIG. 9 illustrates columns/rods grown by the VLS approach.

Crystalline or amorphous silicon or other inorganic semiconductors can also be used as the material forming the collector structure 110. For example, thin film crystalline silicon may be used and doped n or p-typed, as desired. To form the collector structure 110 (e.g., column, fin, honeycomb), the VLS approach may be used with the necessary patterned catalyst 128. A patterned catalyst 128 suitable for column growth is shown in FIG. 8. Such a patterned catalyst may be achieved, for example, by printing gold bearing layers using known printing techniques. Such gold bearing layers may be composed of materials such as Au bearing ink, for example, or functionalized Au nanoparticles designed to adhere to the substrate on contact. With this patterned catalyst seen in FIG. 8 and with the VLS approach, columns, in this example, may be grown as seen in FIG. 9. The catalyst positioned on top of the elements (and any of the walls) may then be removed by straightforward etching. Active material is then positioned among the collector elements. A variety of catalysts may also be used and other semiconductors, as well as metals, may be grown for the collector element function. In general, catalyst deposition and patterning may be attained using positioning techniques comprising stamping, electro-static printing, printing and dip pen or by using other standard physical and vapor phase deposition techniques or electro-chemical deposition with etching or lift off patterning employing block-co-polymer use, imprinting, or beam or optical lithography.

Figure 10:
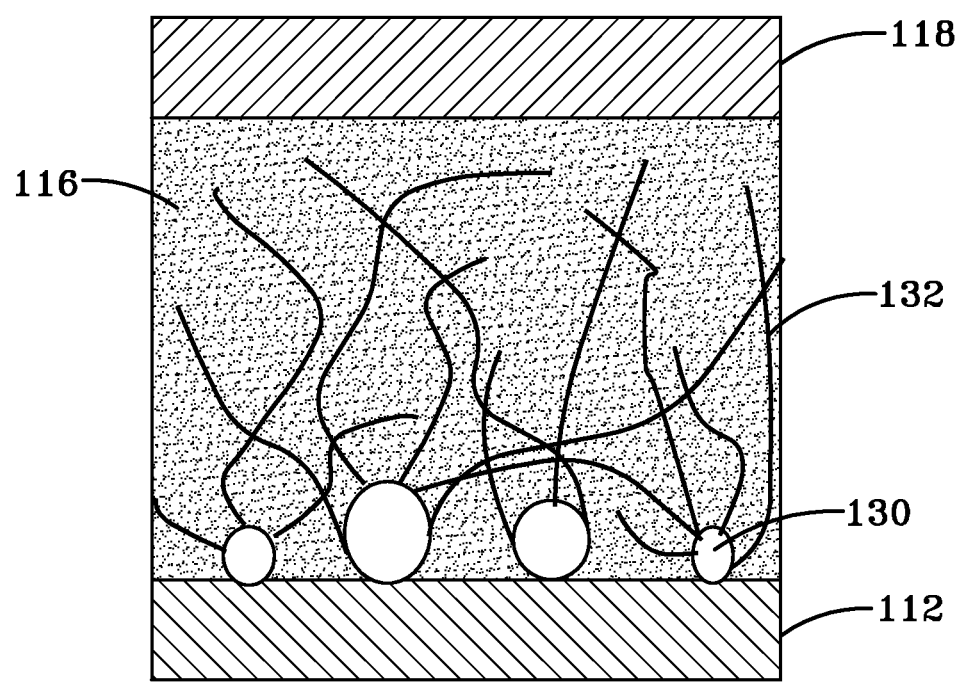
FIG. 10 illustrates nano-elements grown from catalytic nano-particles, embedded in the active layer of a photovoltaic structure.
Figure 11:
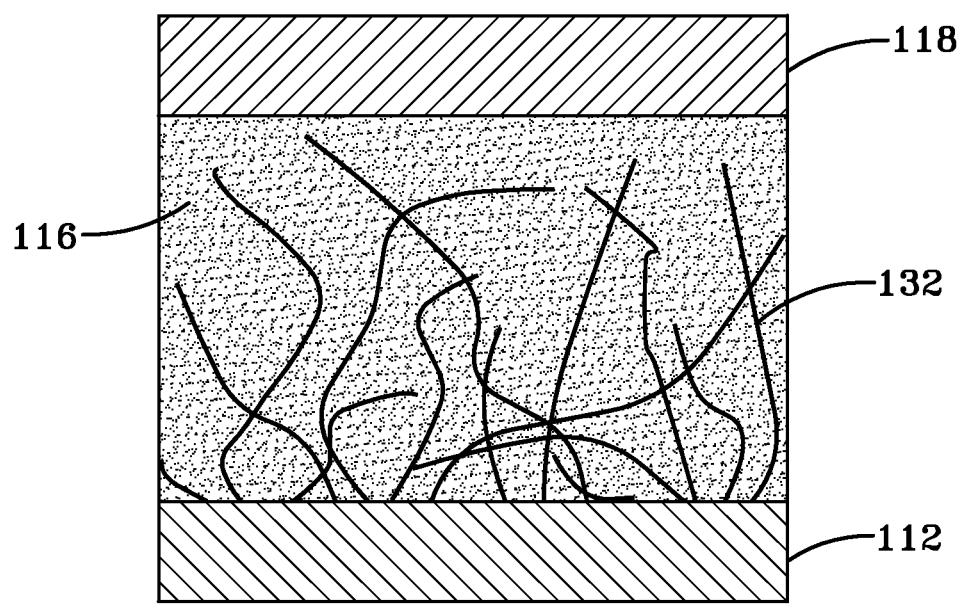
FIG. 11 illustrates nano-elements grown from a discontinuous catalyst film embedded in the active layer of a photovoltaic structure.

Depending on the details of the catalyst type and shape and whether it is composed of particles (FIG. 10) or is a discontinuous film (FIG. 11) the degree to which the collector elements are perpendicular to the substrate may vary. In the structure of FIGS. 10 and 11, which specifically show this situation for the case of nano-elements 132, light may enter into the device through the top conductor 118 or the bottom conductor 112. One conductor, e.g., the bottom conductor 112 in FIG. 10, has nano-elements 132, e.g., nanowires or nanotubes, electrically connected to the surface-covering conductor and extending from the conductor to penetrate into an active layer 116. The other conductor, e.g., the top conductor 118 in FIG. 10, does not necessarily have nano-elements, which is the case shown in FIG. 10. The nano-elements 132 are intended to aid in photogenerated carrier collection. If the bottom conductor 112 in FIG. 10 is the anode, then the nano-elements 132 are designed to collect holes (whether free holes collected from the active layer, holes produced by breaking up excitons at the elements' surface, or some combination thereof). If the bottom conductor 112 in FIG. 10 is the cathode, then the nano-elements 132 are designed to collect electrons (whether free electrons collected from the active layer, electrons produced by breaking up excitons at the elements' surface, or some combination thereof). The material composition of the nano-elements 132 is selected to enhance the mobility of the collected carrier, to provide the requisite workfunction difference (with the top conductor 118) to aid in setting up the built-in collecting electric field, or to have band steps (off-sets) to aid in collection, or some combination thereof. The photogenerated entities to be collected are created in the active material, which may be an organic, inorganic, or combination materials system positioned between the conductors 112, 118 and among the penetrating nano-elements 132. The active layer 116 may contain semiconductors, dyes, quantum dots, metal nanoparticles, or combinations thereof. The active layer material can be a light absorber or mixture of the absorber and generated-charge collector or collectors. Active layer materials systems may be produced by various growth and deposition approaches including chemical and electrochemical means, chemical vapor deposition, or physical vapor deposition. The active layer materials systems may also contain electrolytes.

The structures of FIGS. 10 and 11 can be positioned and produced using catalytic approaches. The nano-particles 130 seen in FIG. 10 act as a catalyst for the growth of the nano-elements 132 penetrating the active layer 116. The nano-particles 130 may or may not remain after the nano-element 132 growth. The metal nano-particles 130 can be designed to remain after growth to be used to generate plasmons to enhance light absorption on the active layer 116.

The nano-elements 132 may be grown first and then the active layer 116 grown or deposited around the nano-elements 132. For example, nano-particle/element (nano-wire or nano-tube) systems can be gold nano-particles for the growth of silicon nano-wires and iron or iron based nano-particles for the growth of carbon nano-tubes and nano-filaments. As a specific example, in the case of Si, the silicon nano-wires may be grown on the bottom electrode by first depositing the catalyst nano-particles by spinning, spraying, stamping, printing, or other dispersive techniques including the use of bacteria. Subsequently, the coated bottom conductor is placed in a growth chamber for Si nano-wire growth, which may be accomplished, for example, by the vapor-liquid-solid (VLS) technique using low pressure chemical vapor deposition (LPCVD) with a Si precursor gas such as silane, di-chloro-silane, etc., perhaps with a dopant gas as for nano-wire doping during growth. The density and directions of the resulting nano-wires can be adjusted using catalyst size, type, and arrangement and deposition parameters. The same catalytic approaches may be used for the growth of other semiconductor nano-structures such as C, ZnO, GaN, and CdTe nanotubes and nanowires.

In the case of carbon, the carbon nano-channels or nano-filaments may be grown on the bottom conductor by first depositing the catalyst nano-particles by spinning, spraying, or other dispersive techniques. Subsequently the coated bottom conductor is placed in a growth chamber for carbon nano-tube or nano-filament (nanowire) growth (e.g., by using a carbon precursor gas and low pressure chemical vapor deposition (LPCVD)).

Depending on the catalyst nano-particle size and element growth conditions, the catalyst nano-particles 130 seen in FIG. 10 may actually disappear from the bottom conductor 112 during growth due to their riding on the top of the growing nano-element 132 or their being incorporated into the growing nano-element 132. The resulting nano-wires or nano-channels produced from this catalyst driven deposition may have a random orientation as seen in FIG. 10 or be more ordered perpendicularly to the bottom conductor 112, depending on catalyst nano-particle size and growth conditions. In either case, the resulting nano-elements 132 collect laterally at least over some part of their penetration into the active layer 116.

As an alternative to positioning catalyst nano-particles 130 on the bottom conductor 112 or top conductor 118, a discontinuous film of the catalyst material can be deposited by chemical vapor or physical vapor deposition or can be produced by positioning techniques such as dip pen and stamping. For example, physically deposited metal films with a thickness less than about 10 nm are generally discontinuous thereby effectively giving a surface covered by nano-islands which can serve as the catalysts for the required nano-wire or nano-tube growth.

Figure 12:
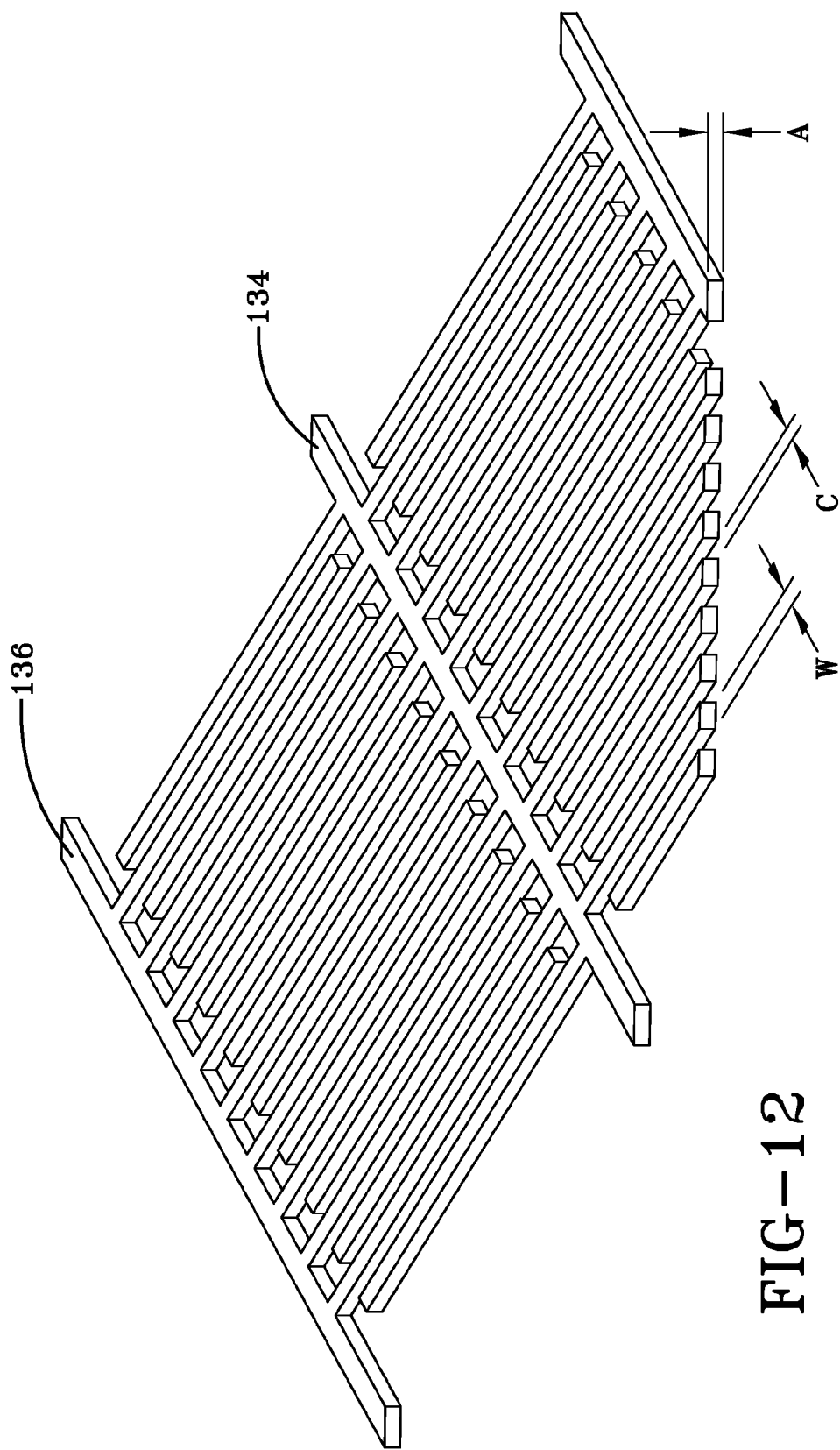
FIG. 12 illustrates an electrode structure of a lateral collection photovoltaic device.

The lateral collection approach can use elements constituting opposing electrodes as shown in FIG. 12. The lateral collection concept does not require that the cathode and anode be arranged as seen in FIGS. 1-7, 10 and 11, i.e., one electrode need not be on top of the other but, instead, the two electrodes can face each other laterally. In the lateral electrode arrangement, the collection of the photogenerated entity (excitions and/or free holes and electrons) is essentially entirely done in a lateral fashion, i.e., at essentially ninety degrees to the absorption length direction. The term "vertical collection length," discussed previously, now refers to a lateral length. Further, the absorption length and the vertical collection length no longer have any bearing on one another. For example, in the embodiment of FIG. 10, the collection of only one carrier, usually that with the poorer mobility, is done at an angle to the absorption length direction. In the lateral collection by lateral arrangement of both electrodes approach, the two electrodes (anode and cathode) are each formed, in general, of an independent array of nano- and/or micro-scale elements.

Figure 13:
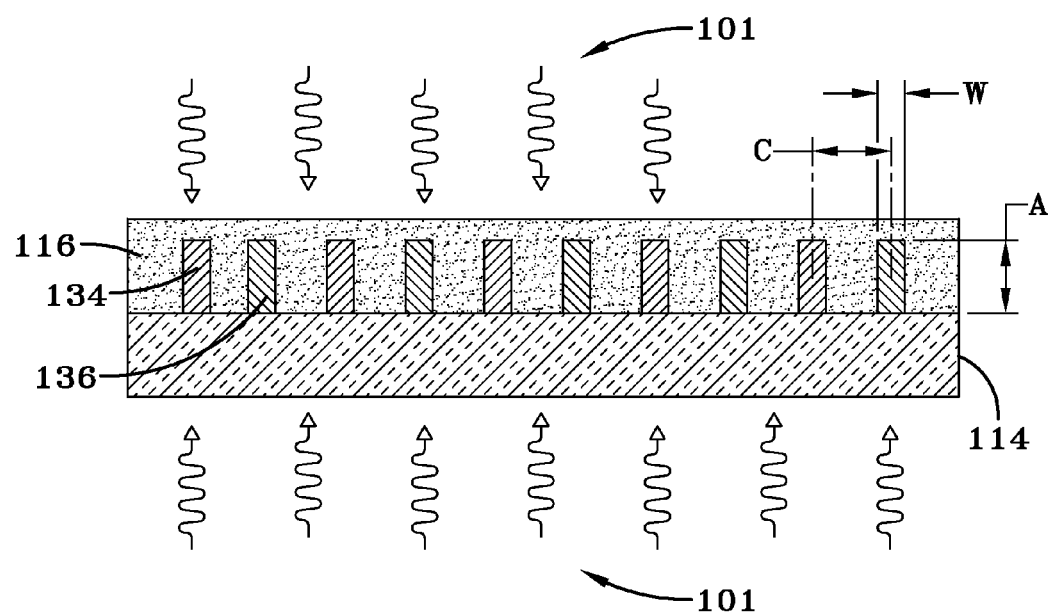
FIG. 13 illustrates a cross-section of the lateral collection photovoltaic device of FIG. 12.
Figure 14:
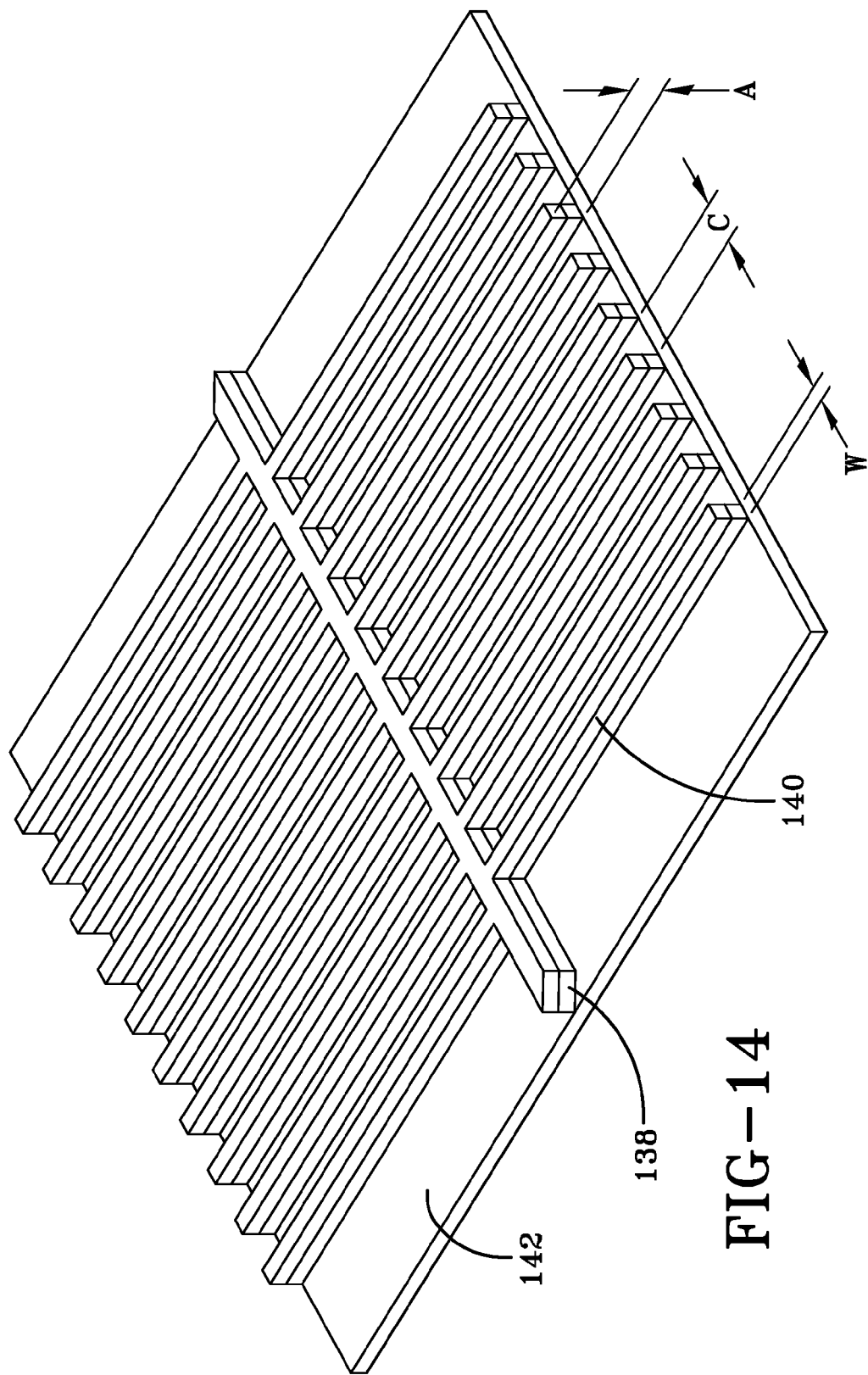
FIG. 14 illustrates a composite electrode structure with one electrode positioned on a second electrode which is on the substrate.
Figure 15:
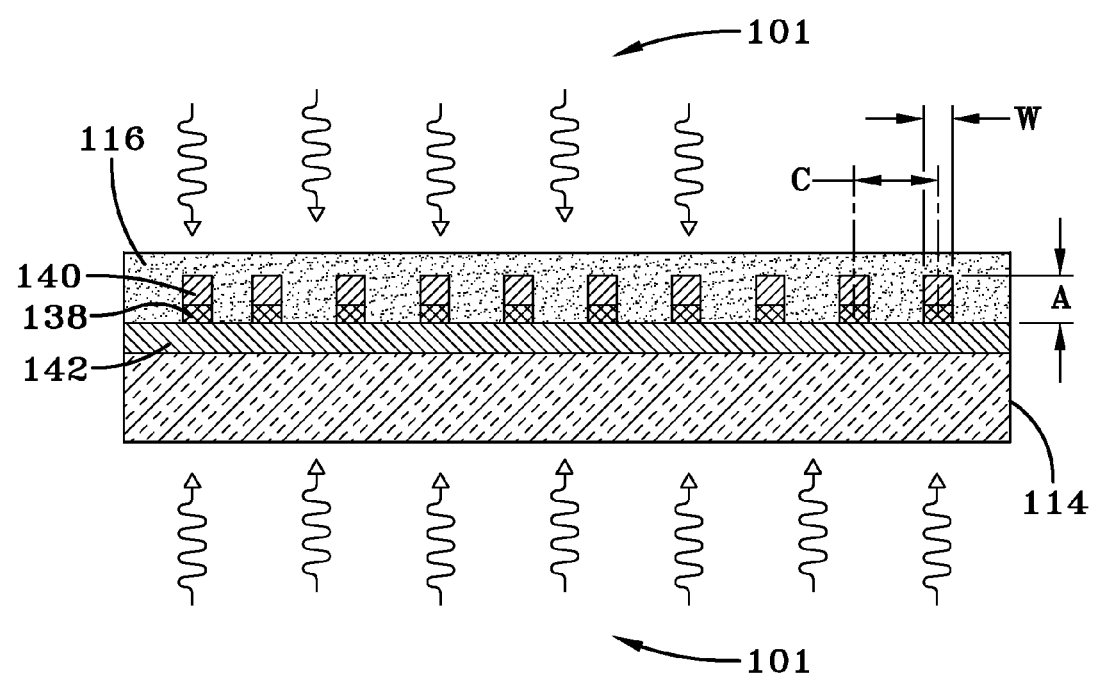
FIG. 15 illustrates a cross-section of a photovoltaic device with the composite electrode structure of FIG. 14.

For the lateral collection by lateral arrangement of both electrodes approach, either the fin structure of FIGS. 12 and 13 or other similar electrode structures can be used. In the embodiment of FIGS. 12 and 13, which may have nano-scale or micro-scale array spacing, the arrangement is such that all components of the first electrode 134 and all components of the second electrode 136 sit on an insulator (not shown) and are electrically isolated from each other with one electrode serving as the anode collecting photogenerated holes (whether produced directly, by excition decomposition, or both) and the other electrode serving as the cathode collecting photogenerated electrons (whether produced directly, by excition decomposition, or both). The photogenerated entities are created in the active material, which may be an organic, inorganic, or combination materials system positioned among the electrodes 134, 136. The active layer may contain semiconductors, dyes, quantum dots, metal nanoparticles, or combinations thereof. The active layer material can be a light absorber or mixture of the absorber and generated-charge collector (separator) materials. The active layer materials systems may be produced by various growth and deposition approaches, as noted earlier, including chemical and electrochemical means, chemical vapor deposition, or physical vapor deposition, including nebulization. The active layer materials systems may also contain electrolytes. The elements of the first electrode 134 may be arranged in a hierarchy as seen in FIG. 12 in which smaller sized elements connect to larger elements to reduce series resistance. The same may be the case for the second electrode 136. In cross-section, the example structure of FIG. 12 would appear as seen in FIG. 13. The active layer 116 may or may not be thicker than the height A of the first electrode 134 and the second electrode 136 structures. The dimension A is preferably equal to the active material absorption length. In addition, the width W of both the first electrode 134 and the second electrode 136 structures should be as small as possible, preferably in the nano-scale range but consistent with series resistance loss and manufacturing considerations. The arrangement of the electrodes 134, 136 as shown in FIGS. 12 and 13 requires no bottom nor top electrode on the active layer 116. In addition, light 101 may enter either through the top or bottom side. A reflector may be positioned at one side. The array separation C between the neighboring elements is of the order of one active material collection length or less. The electrode elements themselves may, in addition to collecting photogenerated entities, (1) be an absorber, (2) enhance light reflection and trapping, (3) be used to attach quantum dots/nano-particles, monolayers, or other materials to enhance performance, and (4) be the source for plasmons for interaction with the absorption process. This embodiment may be used in light generating applications. In the light generating application, the active layer 116 is not absorbing light but producing it. It follows that the electrodes 134, 136 in such a situation are not collecting carriers but are injecting them. As noted earlier, these light emitting structures are essentially operated in the opposite sense as a photovoltaic device and the materials selection is dictated by that necessity.

The anode and cathode of lateral collection photovoltaic structures such as that shown in FIGS. 12 and 13 can be made of materials that create a built-in electric field (or, equivalently, a built-in potential) directed between them, across the active material. The field direction is substantially perpendicular to the absorption length direction. Creating the electric field necessitates that the anode and cathode be pairs such as a high workfunction metal and a low workfunction metal, a p-type semiconductor and an n-type semiconductor, a high workfunction metal and an n-type semiconductor, or a low workfunction metal and a p-type semiconductor. The electrodes 134, 136 may be treated (e.g., with a plasma) or coated with films or with monolayers using self-assembly to adjust the workfunctions. Additionally, the electrode materials may also have energy band steps (off-sets) that act to block holes (at the cathode) or block electrons (at the anode) to assist in carrier collection.

Lateral anode and cathode electrode arrangements, such as that seen in FIGS. 12 and 13, may be fabricated using well known lithography techniques such as photo and e- and ion-beam lithography combined with well established etching and/or lift-off techniques. They also may be fabricated using techniques such as block co-polymer patterning, imprint and step and flash lithography combined with the well established etching or lift-off techniques. Further, they may be fabricated by other techniques such as dip-pen processing, ink jet printing, electrostatic printing and stamping which require no etching nor lift-off. Lateral anode and cathode electrode arrangements, such as that seen in FIGS. 12 and 13, may also be fabricated by laser writing of the pattern in a material that reacts upon photon impingement to form the patterned electrode layout. This may be done sequentially for the first electrode 134 and then the second electrode 136. To obtain the differing materials systems required to create the desired built-in electric field and band steps, the first electrode 134 may be first positioned and then the second electrode 136, using the aforementioned approaches. Alternatively, both sets of electrode elements can be made of the same material and then one electrode is electro-plated with a different material for field and band step creation. This is easily done since each set has an independent connection to the outside world. In general, the materials that are patterned and used to make the first electrode 134 and the second electrode 136 can be grown or deposited.

Lateral anode and cathode electrode arrangements, such as that shown in FIGS. 12 and 13, may also be entirely fabricated using electro-less and/or electrode driven plating such as electro-chemical deposition. The plating can be done, for example, by the positioning of a first conducting pattern for the electro-chemical growth of the first electrode 134 using a first solution and by the positioning of a second conducting pattern for the electro-chemical growth of the second electrode 136 using a second solution. Two electrochemical deposition solutions are used to attain two different materials, as explained, for the anode and cathode. The patterns should be positioned on the insulating substrate in the design required to obtain the electro-chemical deposition of the necessary laterally disposed anode and cathode. For example, in the case of the structure of FIGS. 12 and 13, one pattern would be on the substrate to the form of the first electrode 134 and another electrically isolated pad would be on the substrate to the form of the second electrode 136. Such electrode precursor patterning can be done with optical, beam, and imprinting lithography combined with etching and/or lift-off. Electrode precursor patterning may also be accomplished by techniques such as direct patterning wherein the pattern material is applied in the prescribed pattern by various techniques including stamping, dip pen, printing, electrostatic printing, or ink jet printing. These patterns (e.g., those in the pattern of the example of FIGS. 12 and 13) may then be sequentially electrically biased to electro-chemically deposit an electrode of one material and a second electrode of another material. That is, sequential biasing of the first pattern with the first solution applied to the substrate may be used to obtain the electro-chemical deposition of the first electrode 134 and sequential biasing of the second pattern with the second solution applied to the substrate may be used to obtain the electro-chemical deposition of the second electrode 136.

Electro-chemical deposition may also be used in an alternative manner to obtain the lateral anode and cathode electrode arrangements, such as that seen in FIGS. 12 and 13. A template containing a recessed first material electrode and a second material electrode, patterned, using the techniques discussed earlier, in the arrangement needed for the cathode and anode of the photovoltaic device, is applied to the substrate with an electrochemical deposition solution present. The substrate is conducting. By applying an electrical bias between the first material electrode pattern in the template and the substrate, material forming into the first electrode 134 is thereby deposited on the substrate guided by the template. By sequentially applying an electrical bias between the second material electrode pattern in the template and the substrate, material forming into the second electrode 136 is thereby deposited on the substrate guided by the template. This template can then be stepped and reused. The initial conducting film on the substrate is etched away or converted to an insulator, as needed, to prevent shorting. The concept here uses two different electrodes in the template (of the first and second materials, respectively) and sequential biasing to be able to deposit the two different materials needed for the anode and cathode of the lateral collection layout by lateral arrangement of both electrodes in the template. The technique here also removes or converts the initial thin film covering the surface.

Lateral anode and cathode electrode arrangements, as shown in FIGS. 12 and 13, may be also fabricated using catalyst-controlled growth. Catalyst controlled growth can be performed, for example, by the positioning of catalyst A for the growth of the first electrode 134 and the positioning of catalyst B for the growth of the second electrode 136. These catalysts can be in the pattern required to obtain the necessary laterally disposed anode and cathode. For example, in the case of the structure of FIGS. 12 and 13, catalyst A would be patterned on the substrate in the form of the first electrode 134 and catalyst B would be patterned on the substrate in the form of the second electrode 136. Such catalyst patterning can be done as described above. Included techniques would be optical, beam, and imprinting lithography combined with etching and/or lift-off and applied to grown or deposited catalyst materials. It can be done by laser writing of the pattern in a material which reacts upon photon impingement to form the catalyst (or to directly form the patterned electrode layout). Obtaining patterned catalyst A and catalyst B may be done sequentially. After catalyst application to the substrate, first and second electrodes 134, 136 are grown using their respective catalysts. Electrochemical and chemical processes (e.g., VLS) can also be used.

The application and patterning of catalyst A and of catalyst B can also be done with positioning techniques such as stamping, dip pen, electro-static printing or ink jet printing of catalyst "inks". Such inks may contain particles, self-assembling molecules, layers, or materials, or both which contain the catalyst. Obtaining patterned catalyst A and catalyst B by stamping, dip pen, or ink jet printing can be done by sequential steps with appropriate considerations for alignment. In the case of stamping, an alternative is to simultaneously stamp catalyst A and catalyst B onto a substrate. The latter stamping approach may be accomplished for the structure of FIGS. 12 and 13 by (1) picking up both inks simultaneously by applying the stamp to ink-containing troughs in the pattern of FIGS. 12 and 13 or by (2) applying the inks sequentially to the stamp using dip pen, ink jet, or similar techniques. After catalyst application to the substrate, first and second electrodes 134, 136 are grown using their respective catalysts. Chemical processes (e.g., VLS) are used. The resulting the first electrode and second electrode element cross-sections can then approach the rectangles of FIG. 13. The cross-sections of the first and second electrode elements may be quite close to such overall rectangular shape if the grown first and second electrodes 134, 136 are, for example, closely packed arrays of high aspect ratio nano-particles such as Si nanowire elements (which may be doped during growth) and carbon nanotube elements grown catalytically from the patterned catalysts A and B.

For all the various approaches to producing the lateral collection electrode structures, the organic or inorganic absorber containing active material placement can be achieved in a number of ways, as discussed earlier. Included are the various physical and chemical vapor deposition techniques. Specifically included are nebulization, spraying and spin-on techniques. Materials such as ZnO, GaN, CdSe, PbS, and related semiconductors can be produced using well-known techniques from colloidal chemistry thereby growing the material between first and second electrodes 134, 136 in situ. Inorganic semiconductor materials such as a-Si:H or polycrystalline Si can be vacuum deposited and used, as is. In the case of amorphous materials such as a-Si, a-Ge, etc., SPC including its variant metal induces solid phase crystallization (MISPC), can be used in situ to convert such deposited amorphous semiconductors into crystalline material. Support materials, such as hole conductive layers, electron conductive layers, electrode surface modification, or layers to initiate or provide attachment points for surface modification can be disposed between any layer or on electrode elements.

The anode and cathode of lateral collection structures shown in FIGS. 12 and 13 may themselves also serve as catalysts for active layer formation processes in techniques such as chemical growth or metal induced solid phase crystallization. The anode, the cathode, or both may play the catalyst role. For example, if silicon is the active layer 116, it may be grown in the region between the anode and cathode using VLS chemical growth with one of the electrodes being the VLS catalyst. Depending on the electrode material, and, therefore on the catalyst being used, crystalline Si can be grown this way at temperatures between 300 and 600° C. In the case of SPC of silicon, for example, deposited a-Si can be crystallized into the active layer with MISPC done with various time-temperature annealing procedures using, for example, Ni as one of the electrodes and as the metal enhancing the SPC process.

In the lateral collection by composite electrodes carrier collection approach, at least one electrode (anode or cathode) is a composite structure and first electrode 140 (anode or cathode) and second electrode 142 (cathode or anode) are arranged as depicted in FIGS. 14-17 with the active layer material positioned, as shown. The structures of FIGS. 14-17 are top electrode over bottom electrode configurations as opposed to the lateral electrode configurations given in the example of FIGS. 12 and 13. In the version shown in FIGS. 14 and 15, first electrode 140 is a composite structure and the top of each of element of first electrode 140 is the conducting first electrode material. The conducting first electrode material is seen to be electrically isolated by the insulator 138 in each component from second electrode 142 that resides on the substrate. First electrode and second electrode materials are chosen with the concerns of selecting materials to create a built-in electric field for photogenerated charge carrier collection. Creating this field necessitates that the anode and cathode pairs can be a high workfunction metal and a low workfunction metal, a p-type semiconductor and an n-type semiconductor, a high workfunction metal and an n-type semiconductor, or a low workfunction metal and a p-type semiconductor. The first and second electrodes 140, 142 may be treated (e.g., with a plasma) or coated with films or with monolayers using self assembly to adjust the workfunctions. The first and second electrode materials also may be chosen to augment field collection by the use of band edge off-sets (steps), which can be particularly useful in exciton decomposition. Collection in this structure will have both lateral and perpendicular (i.e., parallel to the absorption length) aspects. The insulator 138 required in the approach of FIGS. 14 and 15 may be produced by techniques comprising deposition, electrochemical reactions, and growth including oxidation or nitridation.

Figure 16:
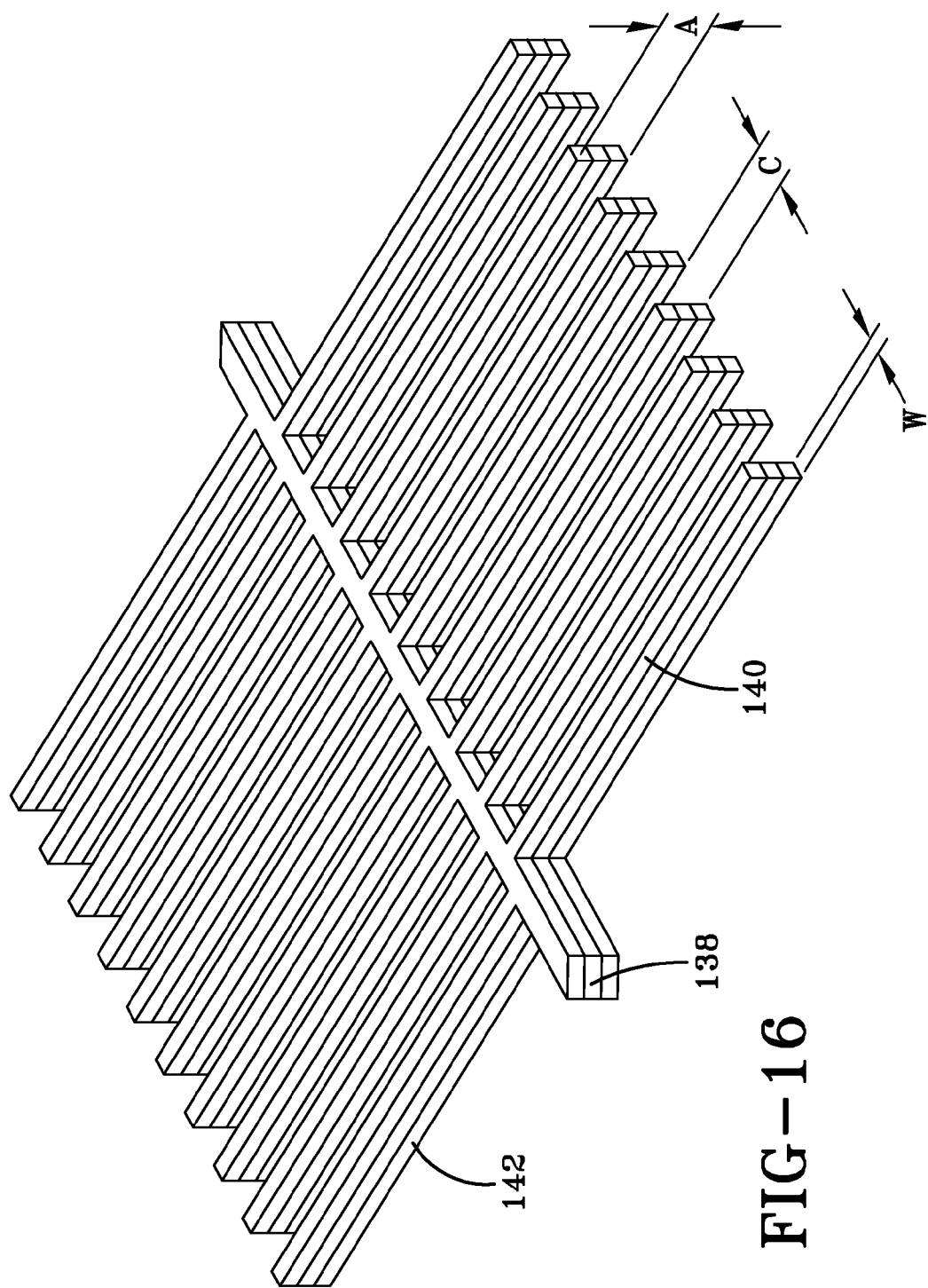
FIG. 16 illustrates a composite electrode structure with each component including both electrodes.
Figure 17:
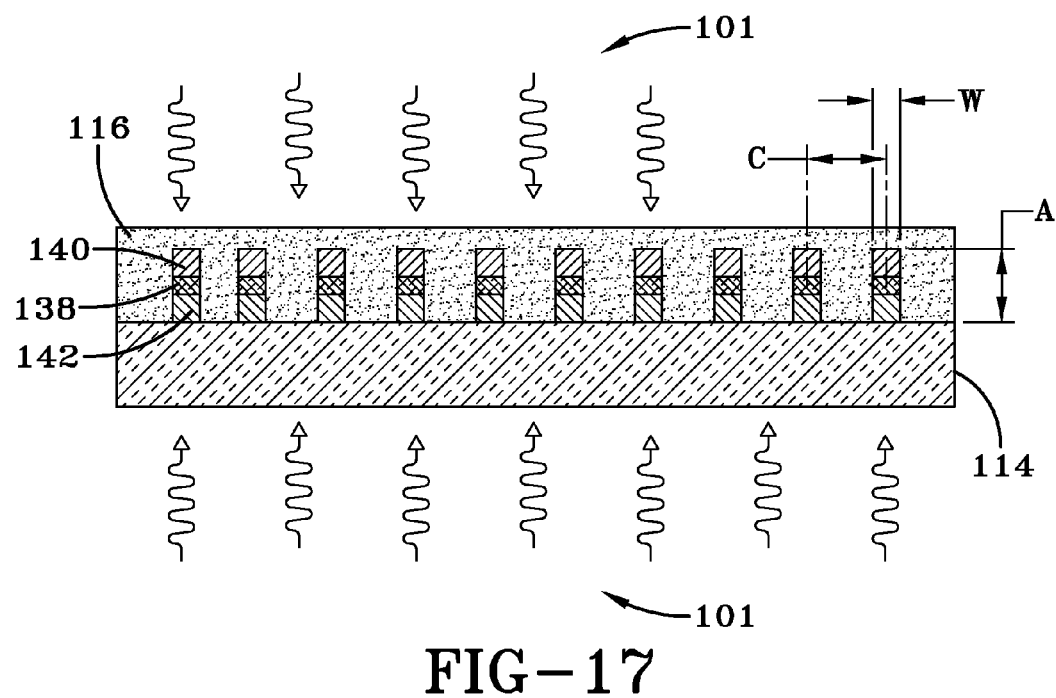
FIG. 17 illustrates a cross-section of a photovoltaic device with the composite electrode structure of FIG. 16.

In the embodiment shown in FIGS. 16 and 17, each element is a composite structure containing first electrode and second electrode components separated by an insulator 138. The two electrodes 140, 142 are then independently contacted (not shown) for connecting to an external circuit. First electrode and second electrode materials are chosen with the usual concerns of selecting materials to create a built-in electric field for photogenerated entity collection. The first and second electrode materials also may be chosen to augment collection by the use of band edge off-sets (steps). The net result of this structure is that both photogenerated carriers can be collected laterally and vertically. The insulator 138 required in the approach of FIGS. 16 and 17 may be produced by techniques such as deposition, electrochemical reaction, or growth including oxidation or nitridation.

The approaches seen in FIGS. 14-17 offer the alternative of not having to sequentially create the lateral first electrode 134 and second electrode 136 structures needed in FIGS. 12 and 13. The components of FIGS. 14-17 are patterned and fabricated using all the various possibilities discussed earlier including those for the embodiment of FIGS. 12 and 13. The dimension A in the composite electrodes of FIGS. 14-17 is preferably equal to the active material absorption length. In addition, the element width W in FIGS. 14-17 should be as small as possible, if the element material is not being used as an absorber, preferably in the nano-scale range but consistent with series resistance loss and manufacturing considerations.

Figure 18:
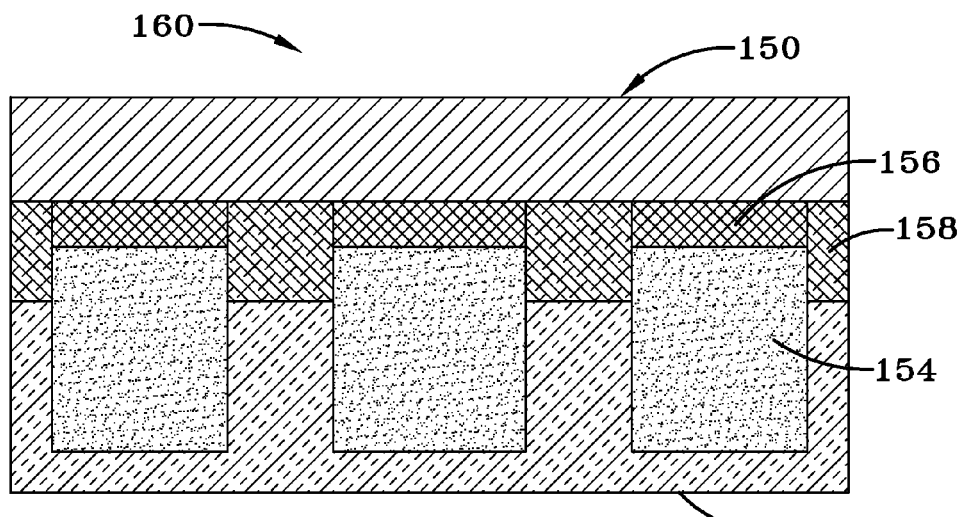
FIG. 18 illustrates a cross-section of a photovoltaic device with an insulator separating the electrodes.

FIG. 18 shows the cross-section of a photovoltaic device where the electrode elements are shown located in the active material. The photovoltaic device 160 includes a first conductor or electrode 150 that can be a non-patterned (non-structured) electrode that is opposite a second electrode 152 that includes an array of collector elements. The second electrode 152 can include the structured collector elements (e.g., columns, nanotubes, nanowires, fins, honeycombs or even molecular wires) for improving photogenerated entity (excitons and/or electrons or holes) collection. Positioned adjacent the second electrode 152 is an active layer 154 and positioned adjacent to the first electrode 150 is a collection material or hole transporting layer (HTL) 156 for augmenting, in this embodiment, hole collection. Between the first and second electrodes 150, 152 can be an insulator or separator material 158. This structure can have been formed by some processing combination comprising etching, growth desposition, lift off or impressing (inlaying).

In this embodiment, the insulator or separator material 158 is present to cap the collector elements of the second electrode 152 to prevent shorting of the device as a result of the second electrode 152 coming into contact with the first electrode 150. The array spacing and elements of second electrode 152 may be on the micro- and/or nano-scale. The use of such insulating cap material can be particularly useful when pressing or imprinting (in laying) the second electrode 152 into the active layer 116.

During fabrication of a photovoltaic device using an impressing technique, first electrode 150 can have the HTL 56 and then the active layer 154 disposed directly on the first electrode 150. The second electrode 152 is then pressed into the active material 154. When doing so, it is possible to short the photovoltaic device by having at least one of the collector elements of the second electrode 152 press through both the active layer 154 to the hole collector material in this example (e.g., the HTL) 156 or even to the first electrode 150. If the second electrode 152 penetrates through the active layer 154 and comes in close proximity with the collector material 156 or first electrode 150, it is possible that the photovoltaic device is shorted.

To prevent the formation of such a shorting situation in a photovoltaic device fabricated by an impressing technique, an insulator or separator material 158 is placed as a cap on the collector elements of the second electrode 152 to prevent the second electrode 152 from coming in contact with the collector material 156, the first electrode 150, or both.

First and second electrodes 150, 152 can be composed of a conductive or semiconductive material. Common materials that may be used for first and second electrodes 150, 152 are, but not limited to, indium tin oxide, aluminum, gold, carbon nanotubes, and lithium fluoride.

The active layer 154 is composed of an absorber and a charge carrier (i.e., a separation material) or any combination thereof. The active layer 154 may include semiconductors, dyes, quantum dots, metal nanoparticles, conductive polymers, conductive small molecules, or combinations thereof. The collector material 156 may be an HTL (typically poly(3,4-ethylenedioxythiophene):poly(styrene sulfonate) (PEDOT:PSS) but may include doped poly(aniline), undoped poly(aniline)) or may be absent completely.

In uses of this cap approach, the insulator 158 can be composed of any non-conductive material that can prevent a short between second electrode 152 and the HTL 156 or the first electrode 150. Typical materials that may be employed may include but are not limited to $SiO_2$, poly (styrene), or poly(methyl methacrylate). The thickness of the insulation layer or insulator 158 should be thicker than the thickness of the collector material 156, so that no electrical contact is made between the conducting part of the second electrode 152 and the collector material 156 and the first electrode 150. If the collector material 156 is not present, then the thickness of the insulator 158 must be that required for insulator integrity and the prevention of any electrical contact between the first and second electrodes 150 and 152.

The second electrode/insulator cap structure can be fabricated through standard lithographic techniques. The second electrode/insulator structure can be fabricated by a number of other techniques including through an evaporation process into an e-beam or block copolymer mask. The second electrode/insulator structure can also be produced by electro-chemical processes. The second electrode/insulator structure may also be fabricated through dry etching through a hard mask. The insulator structure may be used as a hard mask for the etching of the second electrode structure—then left in place to act as the insulator cap structure. The thickness of the insulation layer 158 can be between ideally about 10 to 20 nm thicker than the thickness of the collector (e.g., HTL) material 156, if present. If the collector material 156 is not present, then thickness of the insulator can be in the range of about 5 to 20 nm, as needed for insulator integrity.

It should be understood that the application of the various lateral collection structures is not limited to the details or methodology set forth in the description or illustrated in the figures. It should also be understood that the phraseology and terminology employed herein is for the purpose of description only and should not be regarded as limiting.

While the exemplary embodiments illustrated in the figures and described are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the structures as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. A process for producing a photovoltaic or detector device comprising:
    disposing an array of nano-elements on a conduction layer; and
    applying an active layer on said array of nano-elements on a conduction layer and on said conduction layer, where exposed, said array and said conduction layer constituting one device electrode, said active layer material or active layer material precursor being applied in a vapor form, said active layer material or said active layer material precursor being applied to have array element and conduction layer active layer thickness coverage and controlled to enhance photogeneration and collection of at least one of electrons and holes or excitons.

2. The process of claim 1 wherein the thickness coverage is sufficient above the one device electrode to permit the collection of the electrons and holes arising from the photogeneration in the active material to one of the one device electrode or a device counter-electrode, as charge appropriate, from any location within said active layer.

3. The process of claim 1 wherein the thickness coverage is sufficient to establish an interface for applying a device counter-electrode which follows the morphology produced by vapor deposition.

4. A photovoltaic or detector device comprising:
    a conduction layer;
    an array of nano-elements each having a height, a width dimension parallel to said conduction layer, and a spacing between adjacent nano-elements, said conduction layer and said array of nano-elements forming one device electrode;
    an active layer formed by the process of claim 3 having an active layer thickness coverage; and
    with a device counter-electrode, with the array and conduction layer composition; and
    wherein the array nano-element width, height, and spacing and the active layer thickness coverage being sufficient to concurrently enhance collection of at least one of electrons and holes arising from photogeneration, or excitons arising from photogeneration to the one device electrode or the device counter-electrode and light absorption in said active layer via reflection and light trapping of said one device electrode.

5. The process of claim 1 wherein the height, width dimension parallel to said conduction layer, and the spacing between adjacent nano-elements and thickness coverage of the active layer above the electrode are selected to concurrently support collection of the electrons and holes arising from the photogeneration to their respective electrodes and light absorption in the active layer through reflection and light trapping of said device electrode.

6. The process of claim 1 wherein said applying said active layer is by chemical vapor deposition (CVD).

7. The process of claim 1 wherein said applying said active layer is by physical vapor deposition (PVD).

8. The process of claim 1 wherein said chemical vapor deposition is by one of plasma enhanced CVD or low pressure CVD.

* * * * *